US012640096B2

(12) United States Patent (10) Patent No.: US 12,640,096 B2
Bae et al. (45) Date of Patent: May 26, 2026

(54) DISPLAY DEVICE

(71) Applicant: SAMSUNG DISPLAY CO., LTD.,
Yongin-si (KR)

(72) Inventors: Kwang Soo Bae, Yongin-si (KR); **Gun
Hee Kim, Yongin-si (KR); Hyoeng-Ki
Kim, Yongin-si (KR); Dae-Young Lee**,
Yongin-si (KR); Sun Hee Lee,
Yongin-si (KR); Sanghwan Cho,
Yongin-si (KR)

(73) Assignee: Samsung Display Co., Ltd., Yongin-si
(KR)

( * ) Notice: Subject to any disclaimer, the term of this
patent is extended or adjusted under 35
U.S.C. 154(b) by 0 days.

(21) Appl. No.: 19/006,793

(22) Filed: Dec. 31, 2024

(65) Prior Publication Data

US 2025/0140192 A1 May 1, 2025

Related U.S. Application Data

(63) Continuation of application No. 18/106,950, filed on
Feb. 7, 2023, now Pat. No. 12,183,283.

(30) Foreign Application Priority Data

Apr. 20, 2022 (KR) ........................ 10-2022-0048670

(51) Int. Cl.
*G09G 3/3233* (2016.01)
*H10K 39/34* (2023.01)
(Continued)

(52) U.S. Cl.
CPC ........... *G09G 3/3233* (2013.01); *H10K 39/34*
(2023.02); *H10K 59/122* (2023.02);
(Continued)

(58) Field of Classification Search
CPC ......... G09G 3/3233; G09G 2300/0426; G09G
2300/0819; G09G 2300/0842;
(Continued)

(56) References Cited

U.S. PATENT DOCUMENTS 8,492,728 B2    7/2013   Antonuk
11,074,862 B2   7/2021   Bae et al.
(Continued)

FOREIGN PATENT DOCUMENTS

KR    10-2020-0025078 A    3/2020
KR    10-2021-0024274 A    3/2021

*Primary Examiner* — Nelson M Rosario
(74) *Attorney, Agent, or Firm* — Womble Bond Dickinson
(US) LLP

(57) ABSTRACT

A display device includes: a base layer; a display element
layer on the base layer, and including a light emitting
element, a light detection element, and a photovoltaic ele-
ment adjacent to one another; a light shielding layer on the
display element layer, and having a plurality of opening
parts; and a color filter layer on the display element layer,
and covering the plurality of opening parts. The light detec-
tion element and the photovoltaic element are located at the
same layer as each other, the light detection element is to
detect an external input based on incident light from the
outside, and the photovoltaic element is to generate electri-
cal energy based on the incident light.

20 Claims, 11 Drawing Sheets

(51) Int. Cl.
*H10K 59/122* (2023.01)
*H10K 59/35* (2023.01)
*H10K 65/00* (2023.01)

(52) U.S. Cl.
CPC ........... *H10K 59/353* (2023.02); *H10K 65/00* (2023.02); *G09G 2300/0819* (2013.01); *G09G 2300/0852* (2013.01); *G09G 2330/021* (2013.01); *G09G 2360/14* (2013.01)

(58) Field of Classification Search
CPC ... G09G 2300/0852; G09G 2300/0861; G09G 2310/0251; G09G 2310/08; G09G 2320/0295; G09G 2330/021; G09G 2354/00; G09G 2360/14; H10K 39/34; H10K 50/805; H10K 50/844; H10K 50/865; H10K 59/122; H10K 59/131; H10K 59/352; H10K 59/353; H10K 59/38; H10K 59/40; H10K 59/60; H10K 59/65; H10K 65/00
See application file for complete search history.

(56) References Cited

U.S. PATENT DOCUMENTS

| | | | | |
|---|---|---|---|---|
| 2010/0284055 A1* | 11/2010 | Kothari | ................ | H10K 59/876 |
| | | | | 359/291 |
| 2021/0034832 A1 | 2/2021 | Lee et al. | | |
| 2021/0056899 A1* | 2/2021 | Bae | ...................... | G09G 3/3233 |
| 2021/0057490 A1 | 2/2021 | Choi et al. | | |
| 2021/0142026 A1 | 5/2021 | Hao et al. | | |

* cited by examiner

FIG. 12

DISPLAY DEVICE

CROSS-REFERENCE TO RELATED APPLICATIONS

This application is a continuation of U.S. patent application Ser. No. 18/106,950, filed Feb. 7, 2023, now U.S. Pat. No. 12,183,283, which claims priority to and the benefit of Korean Patent Application No. 10-2022-0048670, filed Apr. 20, 2022, the entire content of both of which is incorporated herein by reference.

BACKGROUND

1. Field

Aspects of embodiments of the present disclosure relate to a display device, and more particularly, to a display device having reduced power consumption.

2. Description of Related Art

A display device provides various functions that enable organic communication with users, such as providing information to users by displaying an image or sensing a user's input. Recently, display devices may include a function for detecting a user's biometric information.

A biometric information recognition method includes a capacitive method for detecting a change in capacitance formed between electrodes, an optical method for detecting incident light using an optical sensor, and an ultrasonic method for sensing vibration using a piezoelectric material.

The above information disclosed in this Background section is for enhancement of understanding of the background of the present disclosure, and therefore, it may contain information that does not constitute prior art.

SUMMARY

One or more embodiments of the present disclosure are directed to a display device capable of biometric recognition, and having reduced power consumption.

One or more embodiments of the present disclosure are directed to a display device including a light detection element and a photovoltaic element having reduced power consumption, while maintaining or substantially maintaining a light emitting lifetime.

According to one or more embodiments of the present disclosure, a display device includes: a base layer; a display element layer on the base layer, and including a light emitting element, a light detection element, and a photovoltaic element adjacent to one another; a light shielding layer on the display element layer, and having a plurality of opening parts; and a color filter layer on the display element layer, and covering the plurality of opening parts. The light detection element and the photovoltaic element are located at the same layer as each other, the light detection element is configured to detect an external input based on incident light from the outside, and the photovoltaic element is configured to generate electrical energy based on the incident light.

In an embodiment, a plurality of light emitting areas may be defined in the display element layer, each of the plurality of light emitting areas including a corresponding light emitting element. A first area, and a second area spaced from the first area, with at least one light emitting area located therebetween, may be defined between the plurality of light emitting areas. The light detection element may be located at the first area, and the photovoltaic element may be located at the second area.

In an embodiment, the first area may be spaced from an adjacent light emitting area from among the plurality of light emitting areas by a first width, the second area may be spaced from an adjacent light emitting area from among the plurality of light emitting areas by a second width, and the first width and the second width may be the same as each other.

In an embodiment, the plurality of light emitting areas may include a first light emitting area for emitting a first color light, a second light emitting area for emitting a second color light, and a third light emitting area for emitting a third color light. The first light emitting area, the second light emitting area, and the third light emitting area may be spaced from each other with any one of the first area or the second area therebetween.

In an embodiment, the plurality of opening parts of the light shielding layer may include: a first opening part corresponding to the light emitting element; a second opening part corresponding to the light detection element; and a third opening part corresponding to the photovoltaic element.

In an embodiment, a size of the second opening part may be smaller than a size of the third opening part.

In an embodiment, a size of the second opening part may be smaller than an area of the light detection element in a plan view.

In an embodiment, a size of the third opening part may be equal to or smaller than an area of the photovoltaic element in a plan view.

In an embodiment, the color filter layer may include: a first color filter overlapping with the light detection element; and a second color filter overlapping with the photovoltaic element, and the first color filter and the second color filter may be different from each other.

In an embodiment, the light emitting element may include: a first electrode; a second electrode facing the first electrode; and a light emitting layer between the first electrode and the second electrode, and configured to emit a first color light, a second color light, or a third color light.

In an embodiment, the light detection element may include a light receiving layer configured to convert the incident light into an electrical signal, the photovoltaic element may include a photovoltaic cell layer configured to receive the incident light to generate electrical energy, and the light emitting layer, the light receiving layer, and the photovoltaic cell layer may be located at the same layer as each other.

In an embodiment, the display device may further include: a thin film encapsulation layer on the display element layer; and an input detection layer on the thin film encapsulation layer. The input detection layer may be directly on the thin film encapsulation layer.

According to one or more embodiments of the present disclosure, a display device includes: a plurality of light emitting elements in a plurality of light emitting areas, respectively; a first element at a first area defined between the plurality of light emitting areas, and configured to detect an external input based on incident light incident from the outside; and a second element at a second area defined between the plurality of light emitting areas, and configured to generate electrical energy based on the incident light. The plurality of light emitting elements, the first element, and the second element are located at the same layer as each other.

In an embodiment, a plurality of unit pixel areas may be defined on a plane, and at least one of the light emitting elements, the first element, and the second element may be located in each of the unit pixel areas.

In an embodiment, the plurality of light emitting areas may include: a first light emitting area configured to emit a first color light; a second light emitting area configured to emit a second color light; and a third light emitting area configured to emit a third color light, and each of the plurality of unit pixel areas may include: any one of the first light emitting area or the second light emitting area; the third light emitting area; and the first area and the second area.

In an embodiment, a planar shape of the first element and a planar shape of the second element may be different from each other.

In an embodiment, the display device may further include: a base layer; a circuit layer on the base layer, and including: a pixel driving circuit connected to a light emitting element from among the light emitting elements; a first sensor driving circuit connected to the first element; and a second sensor driving circuit connected to the second element; and a display element layer on the circuit layer, and including the light emitting element, the first element, and the second element.

In an embodiment, the display device may further include a light blocking pattern having first opening parts corresponding to the plurality of light emitting areas, a second opening part corresponding to the first area, and a third opening part corresponding to the second area.

In an embodiment, a size of the second opening part may be smaller than a size of the third opening part.

In an embodiment, in a plan view, a size of the second opening part may be equal to or smaller than an area of the first element, and a size of the third opening part may be equal to or larger than an area of the second element.

In an embodiment, the display device may further include: a plurality of first color filters overlapping with the plurality of light emitting elements, respectively; a second color filter overlapping with the first element; and a third color filter overlapping with the second element. The first color filters may include a first color color filter, a second color color filter, or a third color color filter. The second color filter may include the second color color filter, and the third color filter may include the third color color filter.

BRIEF DESCRIPTION OF THE DRAWINGS

The above and other aspects and features of the present disclosure will be more clearly understood from the following detailed description of the illustrative, non-limiting embodiments with reference to the accompanying drawings. In the drawings:

FIG. 12 is a cross-sectional view illustrating a pixel of a display panel according to an embodiment.

DETAILED DESCRIPTION

Figure 1:
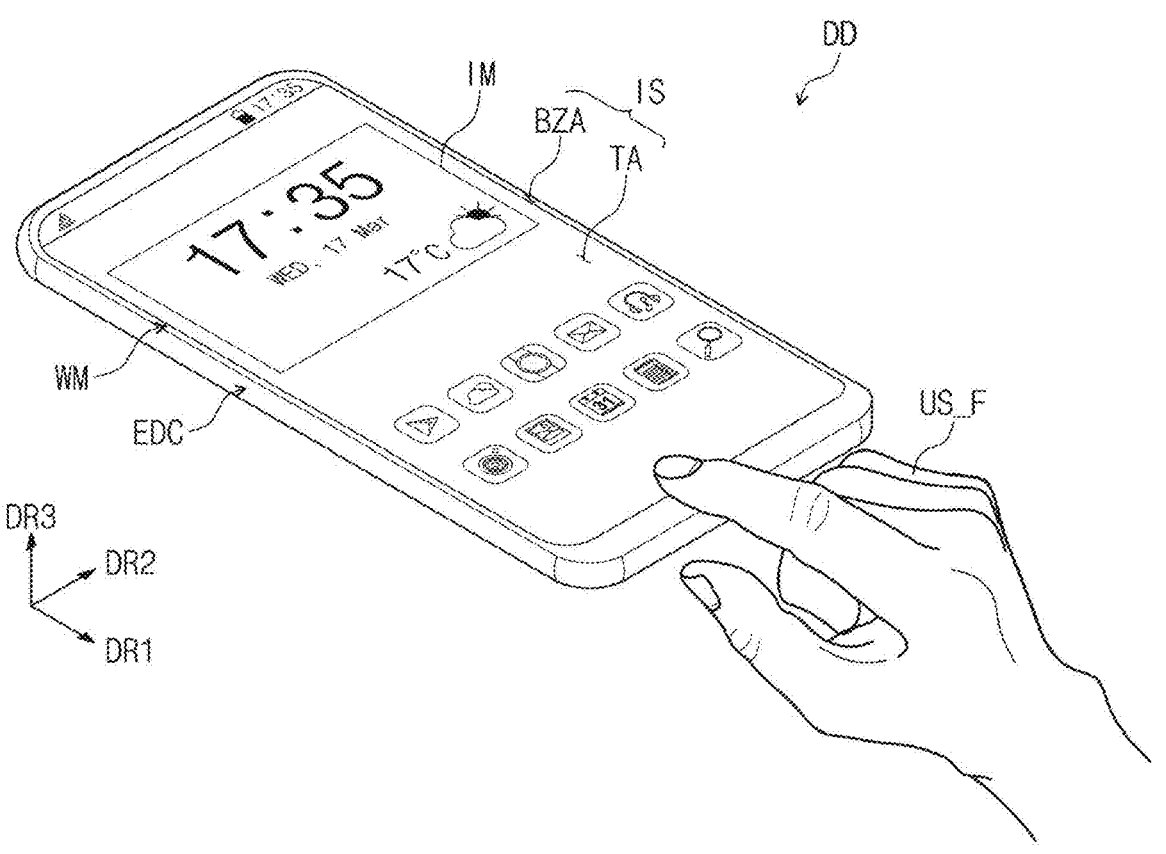
FIG. 1 is a perspective view of a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
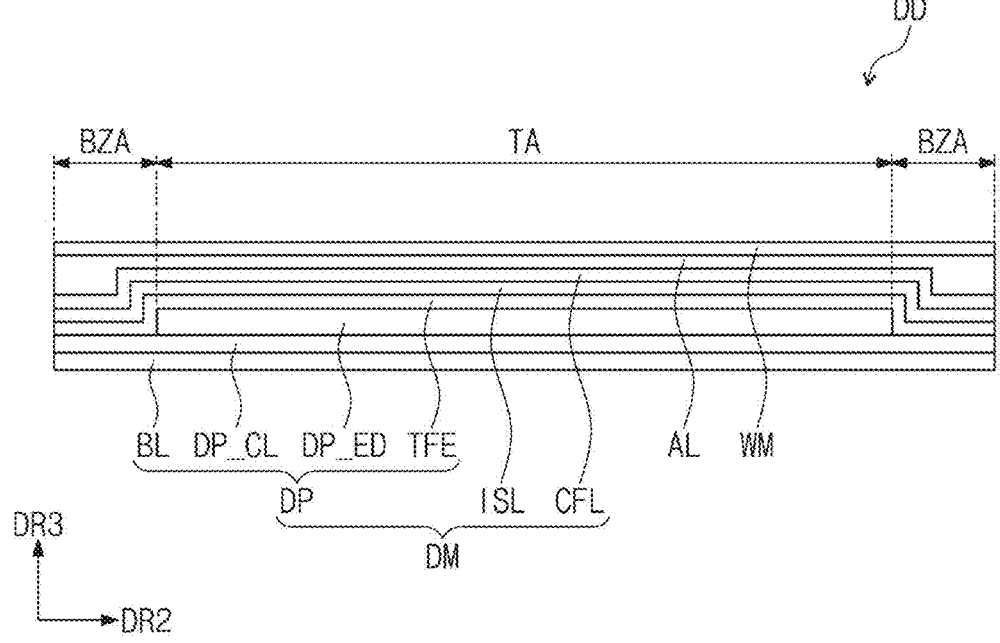
FIG. 2 is a cross-sectional view of a display device according to an embodiment.

FIG. 1 is a perspective view of a display device according to an embodiment of the present disclosure, and FIG. 2 is a cross-sectional view of a display device according to an embodiment of the present disclosure.

Referring to FIGS. 1 and 2, a display device DD according to an embodiment of the present disclosure may have a rectangular shape including long sides that are parallel to or substantially parallel to a first direction DR1, and short sides that are parallel to or substantially parallel to a second direction DR2 crossing (e.g., intersecting) the first direction DR1. However, the present disclosure is not limited thereto, and the display device DD may have various suitable shapes, such as another polygon, a circle, and the like.

The display device DD may be activated according to an electrical signal. The display device DD may include various embodiments. For example, the display device DD may be applied to various suitable electronic devices, such as a smart watch, a tablet, a notebook computer, a smart television, and the like.

Hereinafter, a normal direction that is perpendicular to or substantially perpendicular to a plane defined by the first direction DR1 and the second direction DR2 is defined as a third direction DR3. As used in the present specification, the expressions "when viewed from the plane" and "in a plan view" may refer to a state of being viewed from the third direction DR3.

An upper surface of the display device DD may be defined as a display surface IS, and may have a plane defined by the first direction DR1 and the second direction DR2. Images IM generated by the display device DD may be provided to the user through the display surface IS.

The display surface IS may be divided into a transmission area TA, and a bezel area BZA. The transmission area TA may be an area where the images IM are displayed. The user recognizes the images IM through the transmission area TA. In the present embodiment, the transmission area TA is illustrated has having a rectangular shape with rounded vertices. However, the present disclosure is not limited thereto, and the transmission area TA may have various suitable shapes, and thus, is not limited to any particular embodiment.

The bezel area BZA is adjacent to the transmission area TA. The bezel area BZA may have a suitable color (e.g., a predetermined color). The bezel area BZA may surround (e.g., around a periphery of) the transmission area TA. Accordingly, the shape of the transmission area TA may be defined or substantially defined by the bezel area BZA. However, the present disclosure is not limited thereto, and the bezel area BZA may be disposed to be adjacent to only one side of the transmission area TA, the bezel area BZA may partially surround (e.g., around a periphery of) the transmission area TA, or the bezel area BZA may be omitted as needed or desired.

The display device DD may sense an external input applied from the outside. The external input may include various suitable kinds of inputs provided from the outside of the display device DD. For example, the external input may include an external input that is applied close to or spaced at a suitable distance (e.g., a predetermined distance) from the display device DD (e.g., such as hovering), as well as a contact by a portion of the user's body, such as the user's hand US_F. In addition, the external input may have various suitable forms, such as force, pressure, temperature, light, and/or the like.

The display device DD may detect the user's biometric information applied from the outside. The biometric information may correspond to, for example, the user's fingerprint information. A biometric information detection area capable of detecting the user's biometric information may be provided at (e.g., in or on) the display surface IS of the display device DD. The biometric information detection area may be provided at (e.g., in or on) an entire area of the transmission area TA, or may be provided at (e.g., in or on) a partial area of the transmission area TA. FIG. 1 illustrates that the entire transmission area TA is utilized as the biometric information detection area, but the present disclosure is not limited thereto, and the biometric information detection area may be provided at (e.g., in or on) a portion of the transmission area TA.

The display device DD may include a window WM, a display module (e.g., a display or a touch-display) DM, and a housing EDC. In the present embodiment, the window WM and the housing EDC are combined with (e.g., are connected to or attached to) each other to form an exterior of the display device DD.

The front surface of the window WM defines the display surface IS of the display device DD. The window WM may include an optically transparent insulating material. For example, the window WM may include glass or plastic. The window WM may have a multilayered structure or a single layer structure. For example, the window WM may include a plurality of plastic films that are bonded to one another with an adhesive, or may include a glass substrate and a plastic film bonded to each other with an adhesive.

The display module DM may include a display panel DP and an input detection layer ISL. The display panel DP may display an image according to an electrical signal, and the input detection layer ISL may detect an external input applied from the outside. The external input may be provided in various suitable forms, as described above.

The display panel DP according to an embodiment of the present disclosure may be a light emitting display panel, but is not particularly limited. For example, the display panel DP may be an organic light emitting display panel, an inorganic light emitting display panel, or a quantum dot light emitting display panel. A light emitting layer of the organic light emitting display panel may include an organic light emitting material, and the light emitting layer of the inorganic light emitting display panel may include an inorganic light emitting material. The light emitting layer of the quantum dot light emitting display panel may include a quantum dot, a quantum rod, and/or the like. Hereinafter, for convenience, the display panel DP may be described in more detail in the context of the organic light emitting display panel, but the present disclosure is not limited thereto.

Referring to FIG. 2, the display panel DP includes a base layer BL, a circuit layer DP_CL, a display element layer DP_ED, and an encapsulation layer TFE. The display panel DP according to one or more embodiments of the present disclosure may be a flexible display panel. However, the present disclosure is not limited thereto. For example, the display panel DP may be a foldable display panel that is foldable based on a folding axis, or a rigid display panel.

The base layer BL may include a synthetic resin layer. The synthetic resin layer may be a polyimide resin layer, but the material thereof is not particularly limited. In addition, the base layer BL may include a glass substrate, a metal substrate, or an organic/inorganic composite material substrate.

The circuit layer DP_CL is disposed on the base layer BL. The circuit layer DP_CL includes a circuit element, and at least one insulating layer. Hereinafter, the insulating layer included in the circuit layer DP_CL is referred to as an intermediate insulating layer. The intermediate insulating layer includes at least one intermediate inorganic layer, and at least one intermediate organic layer. The circuit element may include a pixel driving circuit of (e.g., included in) each of a plurality of pixels for displaying an image, and a sensor driving circuit of (e.g., included in) each of a plurality of sensors for recognizing external information. The external information may be biometric information. As an example, the sensor may be a fingerprint recognition sensor, a proximity sensor, an iris recognition sensor, or the like. Also, the sensor may be an optical sensor that recognizes biometric information in an optical manner. The circuit layer DP_CL may further include a pixel driving unit (e.g., a pixel driver) including the pixel driving circuit, a sensor driving unit (e.g., a sensor driver) including the sensor driving circuit, and signal lines connected thereto.

The display element layer DP_ED may include a light emitting element for (e.g., included in) each of the pixels, a light detection element for (e.g., included in) each of the sensors, and a photovoltaic element for (e.g., included in) each of a plurality of photovoltaic cells. As an example, the light detection element may be a photodiode. The light detection element may be an optical fingerprint sensor to detect light reflected by the user's fingerprint. The photovoltaic element may correspond to the photovoltaic cell (e.g., an optical photovoltaic cell) that generates electrical energy based on externally input light (e.g., such as sunlight). The display element layer DP_ED will be described in more detail below.

The encapsulation layer TFE encapsulates the display element layer DP_ED. The encapsulation layer TFE may include at least one organic layer, and at least one inorganic layer. The inorganic layer may include an inorganic material, and may protect the display element layer DP_ED from moisture and/or oxygen. The inorganic layer may include a silicon nitride layer, a silicon oxynitride layer, a silicon oxide layer, a titanium oxide layer, or an aluminum oxide layer, but is not particularly limited thereto. The organic layer may include an organic material, and may protect the display element layer DP_ED from foreign substances, such as dust particles.

The input detection layer ISL may be formed on the display panel DP. The input detection layer ISL may be directly disposed on the encapsulation layer TFE. According to an embodiment of the present disclosure, the input detection layer ISL may be formed on the display panel DP by a continuous process. In other words, when the input detection layer ISL is directly disposed on the display panel DP, an adhesive film is not disposed between the input detection layer ISL and the encapsulation layer TFE. However, in another embodiment, an inner adhesive film may be disposed between the input detection layer ISL and the display panel DP. In this case, the input detection layer ISL may not be manufactured by a continuous process with the display panel DP, and after being manufactured through a separate process from that of the display panel DP, the input detection layer ISL may be fixed to (e.g., connected to or attached to) the upper surface of the display panel DP by the inner adhesive film.

The input detection layer ISL may detect an external input (e.g., the user's touch), change the detected external input into an input signal (e.g., a predetermined input signal), and provide the input signal to the display panel DP. The input detection layer ISL may include a plurality of detection electrodes for detecting the external input. The detection electrodes may detect the external input in a capacitive manner. The display panel DP may receive the input signal from the input detection layer ISL, and may generate an image corresponding to the input signal.

The display module DM may further include a color filter layer CFL. As an example, the color filter layer CFL may be disposed on the input detection layer ISL. However, the present disclosure is not limited thereto. For example, the color filter layer CFL may be disposed between the display panel DP and the input detection layer ISL. The color filter layer CFL may include a plurality of color filters.

The display device DD according to an embodiment may further include an adhesive layer AL. The window WM may be attached to the input detection layer ISL by the adhesive layer AL. The adhesive layer AL may include an optically clear adhesive, an optically clear adhesive resin, or a pressure sensitive adhesive (PSA).

The housing EDC is coupled to (e.g., connected to or attached to) the window WM. The housing EDC is coupled to (e.g., connected to or attached to) the window WM to provide a suitable internal space (e.g., a predetermined internal space). The display module DM may be accommodated in the internal space. The housing EDC may include a material having a relatively high rigidity. For example, the housing EDC may include a plurality of frames and/or plates made of glass, plastic, metal, or a suitable combination thereof. The housing EDC may stably protect the components of the display device DD accommodated in the internal space from external impacts. In some embodiments, a battery module (e.g., a battery) for supplying power used for the overall operation of the display device DD may be disposed between the display module DM and the housing EDC.

Figure 3:
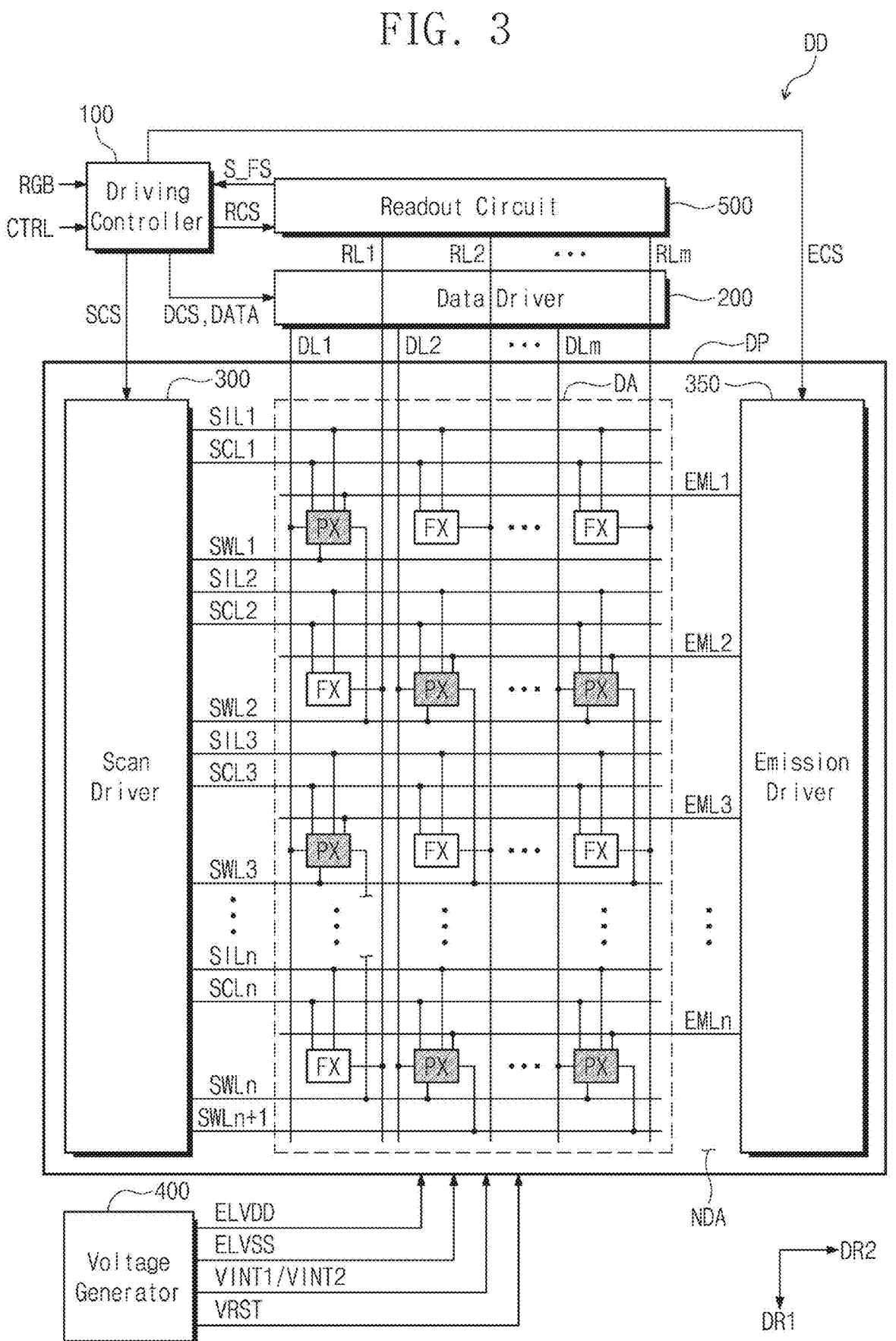
FIG. 3 is a block diagram of a display device according to an embodiment.

FIG. 3 is a block diagram of a display device according to an embodiment.

Referring to FIG. 3, the display device DD includes a display panel DP, a panel driver, and a driving controller 100. As an example, the panel driver includes a data driver 200, a scan driver 300, an emission driver 350, a voltage generator 400, and a readout circuit 500.

The driving controller 100 receives an image signal RGB and a control signal CTRL. The driving controller 100 generates an image data signal DATA obtained by converting a data format of the image signal RGB according to specifications of an interface with the data driver 200. The driving controller 100 outputs a first control signal SCS, a second control signal ECS, a third control signal DCS, and a fourth control signal RCS.

The data driver 200 receives the third control signal DCS and the image data signal DATA from the driving controller 100. The data driver 200 converts the image data signal DATA into data signals, and outputs the data signals to a plurality of data lines DL1 to DLm, which will be described in more detail below. The data signals are analog voltages corresponding to grayscale values of the image data signal DATA.

The scan driver 300 receives the first control signal SCS from the driving controller 100. The scan driver 300 may output scan signals to scan lines in response to the first control signal SCS.

The voltage generator 400 generates voltages used for the operation of the display panel DP. In the present embodiment, the voltage generator 400 generates a first driving voltage ELVDD, a second driving voltage ELVSS, a first initialization voltage VINT1, a second initialization voltage VINT2, and a reset voltage VRST.

The display panel DP includes a display area DA corresponding to the transmission area TA (e.g., see FIG. 1), and a non-display area NDA corresponding to the bezel area BZA.

The display panel DP may include a plurality of pixels PX disposed at (e.g., in or on) the display area DA, and a plurality of sensors FX disposed at (e.g., in or on) the display area DA. As an example, each of the plurality of sensors FX may be disposed between two corresponding pixels PX that are adjacent to each other. The plurality of pixels PX and the plurality of sensors FX may be alternately disposed along the first and second directions DR1 and DR2.

The display panel DP includes initialization scan lines SIL1 to SILn, compensation scan lines SCL1 to SCLn, write scan lines SWL1 to SWLn+1, emission control lines EML1 to EMLn, the data lines DL1 to DLm, and readout lines RL1 to RLm, where n and m are each a natural number. The initialization scan lines SIL1 to SILn, the compensation scan lines SCL1 to SCLn, the write scan lines SWL1 to SWLn+1, and the emission control lines EML1 to EMLn extend in the second direction DR2. The initialization scan lines SIL1 to SILn, the compensation scan lines SCL1 to SCLn, the write scan lines SWL1 to SWLn+1, and the emission control lines EML1 to EMLn are arranged to be spaced apart from each other along the first direction DR1. The data lines DL1 to DLm and the readout lines RL1 to RLm extend in the first direction DR1, and are arranged to be spaced apart from each other along the second direction DR2.

The plurality of pixels PX are electrically connected to the initialization scan lines SIL1 to SILn, the compensation scan lines SCL1 to SCLn, the write scan lines SWL1 to SWLn+1, the emission control lines EML1 to EMLn, and the data lines DL1 to DLm. Each of the plurality of pixels PX may be electrically connected to four scan lines. For example, as shown in FIG. 3, the pixels PX in a first row may be connected to the first initialization scan line SIL1, the first compensation scan line SCL1, the first write scan line SWL1, and the second write scan line SWL2. The pixels PX in a second row may be connected to the second initialization scan line SIL2, the second compensation scan line SCL2, the second write scan line SWL2, and the third write scan line SWL3.

The plurality of sensors FX are electrically connected to the initialization scan lines SIL1 to SILn, the compensation scan lines SCL1 to SCLn, and the readout lines RL1 to RLm. Each of the plurality of sensors FX may be electrically connected to two scan lines. For example, as shown in FIG. 3, the sensors FX in the first row may be connected to the first initialization scan line SIL1 and the first compensation scan line SCL1. The sensors FX in the second row may be connected to the second initialization scan line SIL2 and the second compensation scan line SCL2.

The scan driver 300 may be disposed at (e.g., in or on) the non-display area NDA of the display panel DP. The scan driver 300 receives the first control signal SCS from the driving controller 100. The first control signal SCS may include a start signal, and a plurality of clock signals. In response to the first control signal SCS, the scan driver 300 may output initialization scan signals to the initialization scan lines SIL1 to SILn, compensation scan signals to the compensation scan lines SCL1 to SCLn, and write scan signals to the write scan lines SWL1 to SWLn+1.

The emission driver 350 may be disposed at (e.g., in or on) the non-display area NDA of the display panel DP. The emission driver 350 receives the second control signal ECS from the driving controller 100. The emission driver 350 may output emission control signals to the emission control lines EML1 to EMLn in response to the second control signal ECS. As another example, the scan driver 300 may be connected to the emission control lines EML1 to EMLn. In this case, the scan driver 300 may output the emission control signals to the emission control lines EML1 to EMLn.

The readout circuit 500 receives the fourth control signal RCS from the driving controller 100. The readout circuit 500 may receive sensing signals from the readout lines RL1 to RLm in response to the fourth control signal RCS. The readout circuit 500 may process detection signals received from the readout lines RL1 to RLm, and may provide the processed detection signals S_FS to the driving controller 100. The driving controller 100 may recognize biometric information based on the detection signals S_FS.

Figure 4:
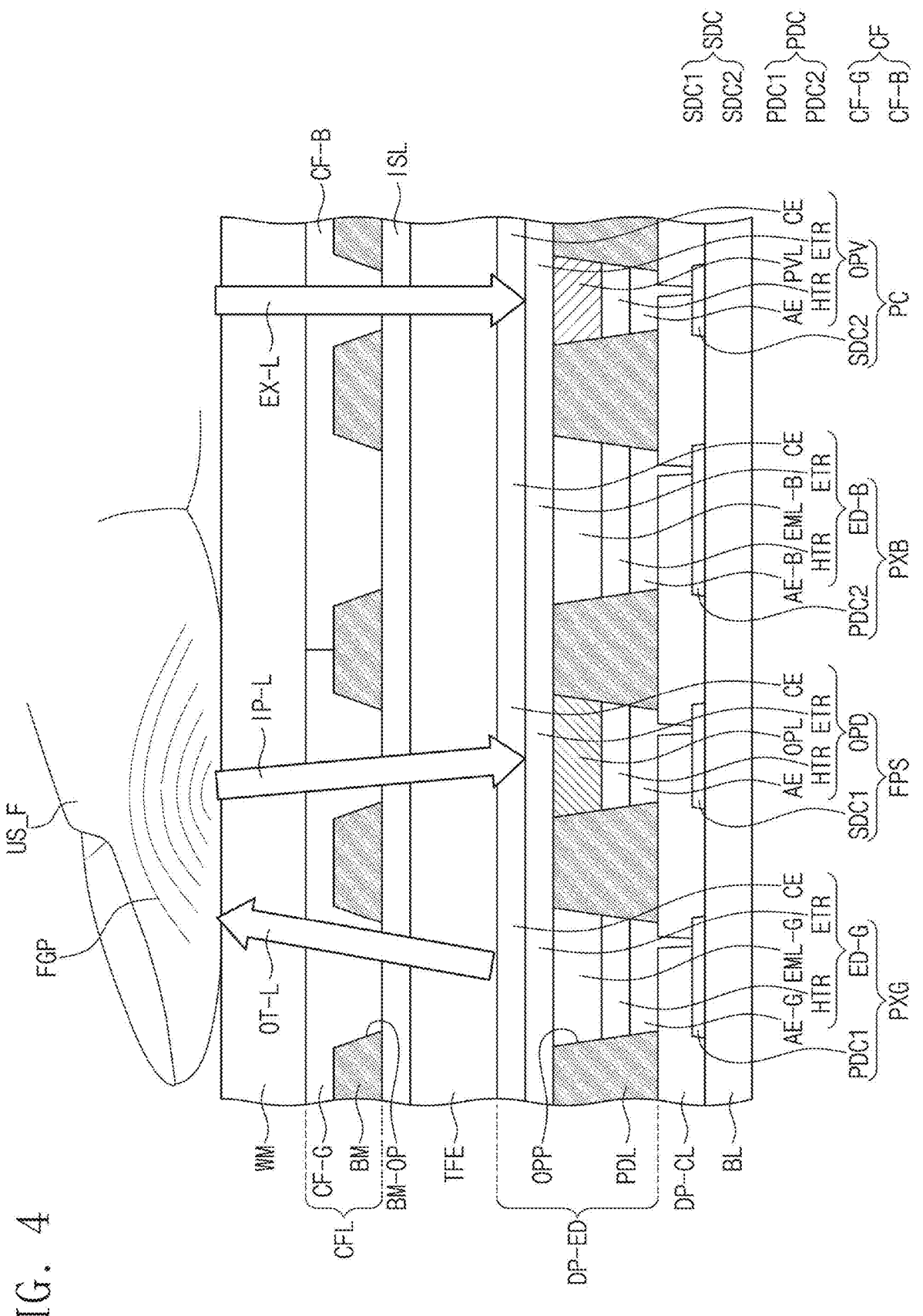
FIG. 4 is a cross-sectional view of a display device according to an embodiment.

FIG. 4 is a cross-sectional view of a display device according to an embodiment of the present disclosure.

FIG. 4 illustrates a state in which an optical sensor FPS recognizes a fingerprint FGP, which is one example of biometric information input through a user's hand US_F. The optical sensor FPS may include a light detection element OPD and a first sensor driving unit (e.g., a first driving circuit) SDC1.

FIG. 4 illustrates a state in which a photovoltaic cell PC recognizes external light EX-L, which is one example of incident light incident from the outside. In an embodiment, the incident light may include reflected light IP-L and the external light EX-L. The external light EX-L may correspond to sunlight (or photovoltaic light). The photovoltaic cell PC may include a photovoltaic element OPV and a second sensor driving unit (e.g., a second sensor driving circuit) SDC2. The photovoltaic cell PC may be disposed at (e.g., in or on) the same layer as that of the optical sensor FPS.

In the display device DD according to an embodiment as illustrated in FIG. 4, emitted light OT-L emitted from a green light emitting element ED-G included in the display element layer DP_ED may be reflected from an external object (e.g., the fingerprint FGP), and incident on a light detection element OPD included in the display element layer DP_ED as the reflected light IP-L. The reflected light IP-L incident on the light detection element OPD may be light in a visible light region. The light detection element OPD may change a driving state of the display device DD based on the incident reflected light IP-L, by converting the reflected light IP-L into an electrical signal, and recognizing an external input. The display device DD shown in FIG. 4 may be the same or substantially the same as one or more embodiments of the display device DD described above with reference to FIGS. 1 through 3, and thus, redundant description thereof may not be repeated.

The photovoltaic element OPV may sense the external light EX-L incident from the outside, and may generate electrical energy used to drive the display device DD. The photovoltaic element OPV may be disposed at (e.g., in or on) the same layer as that of the light detection element OPD, and may be spaced apart from the light detection element OPD on a plane (e.g., in a plan view).

Referring to FIG. 4, the display element layer DP_ED may be disposed on the circuit layer DP_CL. The display element layer DP_ED may include first to third light emitting elements ED-R, ED-G, and ED-B (e.g., see also, FIGS. 8 and 9), the light detection element OPD, and the photovoltaic element OPV. The first light emitting element ED-R may emit a first color of light, the second light emitting element ED-G may emit a second color of light, and the third light emitting element ED-B may emit a third color of light. As used in the present specification, the first color may correspond to red, the second color may correspond to green, and the third color may correspond to blue.

In FIG. 4, for convenience of illustration, one second light emitting element (e.g., green light emitting element) ED-G and one third light emitting element (e.g., blue light emitting element) ED-B are representatively illustrated. The first light emitting element (e.g., red light emitting element)

ED-R may have the same or substantially the same structure as that of the blue light emitting element ED-B or as that of the green light emitting element ED-G, and thus, redundant description thereof may not be repeated. Each of the light emitting elements ED-R, ED-G, and ED-B included in the display element layer DP_ED may include an organic light emitting element, a quantum dot light emitting element, a micro LED light emitting element, or a nano LED light emitting element. However, the present disclosure is not limited thereto, and the light emitting elements ED-R, ED-G, and ED-B may include various suitable embodiments, as long as light is generated or the amount of light may be controlled according to an electrical signal.

The light detection element OPD may be included in an optical sensor FPS that receives and recognizes light reflected by an external object. For example, the light detection element OPD may be a light sensor that recognizes light in a visible light region reflected by the external object. In an embodiment, the light detection element OPD may be a biometric sensor that recognizes light reflected from a user's body part, such as a vein, as well as the user's fingerprint, and converts an optical signal into an electrical signal.

The photovoltaic element OPV may recognize light incident from the outside, for example, such as sunlight. The photovoltaic element OPV may generate electrical energy by recognizing the external light EX-L incident from the outside.

The display element layer DP_ED includes a pixel defining film PDL, and the light emitting elements ED-R, ED-G, and ED-B, the light detection element OPD, and the photovoltaic element OPV may be spaced apart (e.g., may be separated) from each other and divided based on the pixel defining film PDL. The pixel defining film PDL may be disposed on the circuit layer DP_CL, and a plurality of opening parts OPP may be defined in (e.g., may penetrate) the pixel defining film PDL.

In an embodiment, the pixel defining film PDL may be formed of a polymer resin. For example, the pixel defining film PDL may be formed of a polyacrylate-based resin or a polyimide-based resin. In addition, the pixel defining film PDL may be formed by further including an inorganic material, in addition to the polymer resin. In some embodiments, the pixel defining film PDL may be formed by including a light absorbing material, or may be formed by including a black pigment or a black dye. A pixel defining film PDL that is formed including a black pigment or a black dye may implement a black pixel defining film. When forming the pixel defining film PDL, carbon black or the like may be used as the black pigment or the black dye, but the present disclosure is not limited thereto.

In addition, the pixel defining film PDL may be formed of an inorganic material. For example, the pixel defining film PDL may be formed by an inorganic material including silicon nitride (SiNx), silicon oxide (SiOx), silicon oxynitride (SiOxNy), or the like.

The green light emitting element ED-G may include a first electrode AE-G, a second electrode CE, and a light emitting layer EML-G. The blue light emitting element ED-B may include a first electrode AE-B, a second electrode CE, and a light emitting layer EML-B. Each of the first electrode AE-G constituting the green light emitting element ED-G and the first electrode AE-B constituting the blue light emitting element ED-B may be referred to as a light emitting electrode. In an embodiment, the display element layer DP_ED may include the red light emitting element ED-R (e.g., see FIG. 9) disposed to correspond to a red light emitting area and for emitting red light, the green light emitting element ED-G disposed to correspond to a green light emitting area LA-G and for emitting green light, and the blue light emitting element ED-B disposed to correspond to a blue light emitting region and for emitting blue light.

The light detection element OPD may include a first electrode AE, a second electrode CE, and a light receiving layer OPL. The first electrode AE may be exposed in the opening part OPP of the pixel defining film PDL. In the display element layer DP_ED, the first electrodes AE-G, AE-B, and AE may be formed of a metal material, a metal alloy, or a conductive compound. The first electrodes AE-G, AE-B, and AE may be an anode or a cathode. However, the present disclosure is not limited thereto. Also, the first electrodes AE-G, AE-B, and AE may be a pixel electrode or a detection electrode. The first electrodes AE-G, AE-B, and AE may be a transmissive electrode, a transflective electrode, or a reflective electrode. When the first electrodes AE-G, AE-B, and AE are a transmissive electrode, the first electrodes AE-G, AE-B, and AE may include a transparent metal oxide, for example, such as indium tin oxide (ITO), indium zinc oxide (IZO), zinc oxide (ZnO), indium tin zinc oxide (ITZO), and/or the like. When the first electrodes AE-G, AE-B, and AE are a transflective electrode or a reflective electrode, the first electrodes AE-G, AE-B, and AE may include Ag, Mg, Cu, Al, Pt, Pd, Au, Ni, Nd, Ir, Cr, Li, Ca, LiF/Ca, LiF/Al, Mo, Ti, W, or a suitable compound or mixtures (e.g., a mixture of Ag and Mg) thereof.

The second electrode CE may be a common electrode. The second electrode CE may be a cathode or an anode, but the present disclosure is not limited thereto. For example, when the first electrodes AE-G, AE-B, and AE are an anode, the second electrode CE may be a cathode, and when the first electrodes AE-G, AE-B, and AE are a cathode, the second electrode CE may be an anode.

The second electrode CE may be a transmissive electrode, a transflective electrode, or a reflective electrode. When the second electrode CE is a transmissive electrode, the second electrode CE may be formed of a transparent metal oxide, for example, such as indium tin oxide (ITO), indium zinc oxide (IZO), zinc oxide (ZnO), or indium tin zinc oxide (ITZO). When the second electrode CE is a transflective electrode or a reflective electrode, the second electrode CE may include Ag, Mg, Cu, Al, Pt, Pd, Au, Ni, Nd, Ir, Cr, Li, Ca, LiF/Ca, LiF/Al, Mo, Ti, Yb, W, or a suitable compound or mixture (e.g., AgMg, AgYb, or MgAg) thereof.

In an embodiment, the first electrodes AE-G and AE-B, AE included in the display element layer DP_ED are a transflective electrode or a reflective electrode, and the second electrode CE may be a transmissive electrode or a transflective electrode. In other words, in an embodiment, by including the transmissive or transflective second electrode CE, light reflected from an external object may be easily transmitted to the light detection element OPD, and the external light EX-L may be easily transmitted to the photovoltaic element OPV.

The light emitting layer EML-G of the green light emitting element ED-G may be disposed between the first electrode AE-G and the second electrode CE. The light emitting layer EML-G may include an organic light emitting material or a quantum dot material.

In addition, each of the green light emitting elements ED-G may include a hole transport region HTR and an electron transport region ETR. The hole transport region HTR may be disposed between the first electrode AE-G and the light emitting layer EML-G, and the electron transport region ETR may be disposed between the light emitting layer EML-G and the second electrode CE.

The light detection element OPD may be disposed between the first electrode AE and the second electrode CE, and may include the light receiving layer OPL. The light receiving layer OPL may include a light receiving material that receives light, and converts the received light into an electrical signal. For example, in an embodiment, the light receiving layer OPL may include an organic light receiving material. In an embodiment, the light receiving layer OPL may include an organic polymer material as the light receiving material, for example, such as a conjugated polymer. The light receiving layer OPL may include a thiophene-based conjugated polymer, a benzodithiophene-based conjugated polymer, a thieno[3,4-c]pyrrole-4,6-dione (TPD)-based conjugated polymer, a diketo-pyrrole-pyrrole (DPP)-based conjugated polymer, a benzothiadiazole (BT)-based conjugated polymer, and/or the like. However, the present disclosure is not limited thereto.

The photovoltaic element OPV may be disposed between the first electrode AE and the second electrode CE, and include a photovoltaic cell layer PVL. The photovoltaic cell layer PVL may include a cell material that receives light, and converts the light into electrical energy. In an embodiment, the photovoltaic cell layer PVL may include a crystalline silicon-based (C—SI) material. However, the present disclosure is not limited thereto.

The light detection element OPD and the photovoltaic element OPV may include a hole transfer region HTR and an electron transfer region ETR. The hole transfer region HTR may be disposed between the first electrode AE and the light receiving layer OPL or the photovoltaic cell layer PVL, and the electron transfer region ETR may be disposed between the light receiving layer OPL or the photovoltaic cell layer PVL and the second electrode CE.

In an embodiment, the hole transfer region HTR constituting the light emitting element ED-G, the light detection element OPD, and the photovoltaic element OPV may have a single layer structure including (e.g., made of) a single material, a single layer structure including (e.g., made of) a plurality of different materials, or a multilayered structure having a plurality of layers including (e.g., made of) a plurality of different materials. For example, the hole transport region HTR may have a structure of a hole injection layer or a single layer of a hole transport layer, or may have a structure of a single layer including a hole injection material and a hole transport material. In an embodiment, the hole transfer region HTR included in the light emitting element ED-G, the light detection element OPD, and the photovoltaic element OPV includes at least a hole transport layer, and may further include a hole injection layer.

In addition, in an embodiment, the electron transfer region ETR constituting the light emitting element ED-G, the light detection element OPD, and the photovoltaic element OPV may have a single layer structure including (e.g., made of) a single material, a single layer structure including (e.g., made of) a plurality of different materials, or a multilayered structure having a plurality of layers including (e.g., made of) a plurality of different materials.

For example, the electron transport region ETR may have a single-layer structure of an electron injection layer or an electron transport layer, or may have a single-layer structure including an electron injection material and an electron transport material. In addition, the electron transfer region ETR may have a single layer structure including (e.g., made of) a plurality of different materials, or may further include a plurality of layers sequentially stacked from a light emitting layer EML-G. In an embodiment, the electron transfer region ETR included in the light emitting element ED-G, the light detection element OPD, and the photovoltaic element OPV includes at least an electron transport layer, and may further include an electron injection layer.

Still referring to FIG. 4, in an embodiment, the hole transfer region HTR is disposed on a light emitting layer EML-G of a light emitting element ED-G, or a light receiving layer OPL of a light detection element OPD, and may be provided separately by the pixel defining film PDL. Also, in an embodiment, the electron transfer region ETR may be provided as one common layer. The electron transfer region ETR may be provided as a common layer across the light emitting element ED-G and the light detection element OPD. The electron transfer region ETR may overlap with an entirety of the pixel defining film PDL, the light emitting layer EML-G, and the light receiving layer OPL.

The color filter layer CFL may be disposed on the display element layer DP_ED. The color filter layer CFL may include a color filter CF. The color filter CF may include a first color filter (e.g., a red color filter) CF-R (e.g., see FIG. 9), a second color filter (e.g., a green color filter) CF-G, and a third color filter (e.g., a blue color filter) CF-B. The red color filter CF-R, the green color filter CF-G, and the blue color filter CF-B may be portions positioned to correspond to the red light emitting area, the green light emitting area, and the blue light emitting area, respectively. The green color filter CF-G may overlap with the green light emitting element ED-G and the light detection element OPD. The blue color filter CF-B may overlap with the blue light emitting element ED-B and the photovoltaic element OPV.

The color filters CF may transmit red light, green light, and blue light. The color filters CF may include a polymer photosensitive resin and a pigment or dye.

A light shielding layer BM is disposed on the display element layer DP_ED, and may include a plurality of opening parts BM-OP. The light shielding layer BM may be covered by the color filters CF. For example, the plurality of opening parts BM-OP may be covered by the color filters CF.

The light shielding layer BM may be disposed on the input detection layer ISL, and may overlap with a boundary of neighboring color filters CF. The light shielding layer BM may prevent or substantially prevent a light leakage phenomenon, and may distinguish the boundary between adjacent color filters CF.

The light shielding layer BM may be a black matrix. The light shielding layer BM may include an organic pigment or dye. The light shielding layer BM may be formed of an organic light blocking material including a black pigment or a black dye, or an inorganic light blocking material. The light shielding layer BM may be formed from a light blocking composition including propylene glycol monomethyl ether acetate, 3-methoxybutyl acetate, and an organic black pigment. In addition, the light shielding layer BM may overlap with the pixel defining film PDL.

The circuit layer DP_CL may be connected to the display element layer DP_ED to drive the light emitting element ED-G, the light detection element OPD, and the photovoltaic element OPV of the display element layer DP_ED. Still referring to FIG. 4, the circuit layer DP_CL may include a pixel driving unit (e.g., a pixel driving circuit) PDC and a sensor driving unit (e.g., a sensor driving circuit) SDC. The green light emitting element ED-G and a first pixel driving unit PDC1 may constitute a green pixel PXG, and the blue light emitting element ED-B and a second pixel driving unit PDC2 may constitute a blue pixel PXB. The light detection element OPD and the first sensor driving unit SDC1 may constitute an optical sensor FPS, and the photovoltaic element OPV and the second sensor driving unit SDC2 may constitute a photovoltaic cell PC.

The first pixel driving unit PDC1 may include a pixel driving circuit electrically connected to the green light emitting element ED-G to drive the green light emitting element ED-G. A plurality of the first pixel driving units PDC1 may be connected one-to-one with a plurality of the green light emitting elements ED-G. In other words, one first pixel driving unit PDC1 and one green light emitting element ED-G are connected to each other. The green light emitting element ED-G may be an organic light emitting diode. The second pixel driving unit PDC2 and the blue light emitting element ED-B may have the same or substantially the same configuration as that of the first pixel driving unit PDC1 and the green light emitting element ED-G, and thus, redundant description thereof may not be repeated. The pixel driving circuit will be described in more detail below with reference to FIG. 10.

The first sensor driving unit SDC1 may include a sensor driving circuit electrically connected to the light detection element OPD to drive the light detection element OPD. A plurality of the first sensor driving units SDC1 may be connected one-to-one with a plurality of the light detection elements OPD. In other words, one first sensor driving unit SDC1 may be connected to one light detection element OPD. As shown in FIG. 4, one light detection element OPD may include one organic photodiode. In another embodiment, two or more light detection elements OPDs (e.g., n light detection elements, where n is a natural number greater than or equal to 1) may be connected to one first sensor driving unit SDC1. The second sensor driving unit SDC2 may be electrically connected to the photovoltaic element OPV one-to-one. The sensor driving circuit will be described in more detail below with reference to FIG. 10.

A plurality of the first pixel driving units PDC1 may be provided to correspond to the number of green light emitting elements ED-G. A plurality of the second pixel driving units PDC2 may be provided to correspond to the number of blue light emitting elements ED-B. A plurality of the first sensor driving units SDC1 may be provided corresponding to the number of light detection elements OPD. A plurality of the second sensor driving units SDC2 may be provided corresponding to the number of photovoltaic elements OPV.

Figure 5:
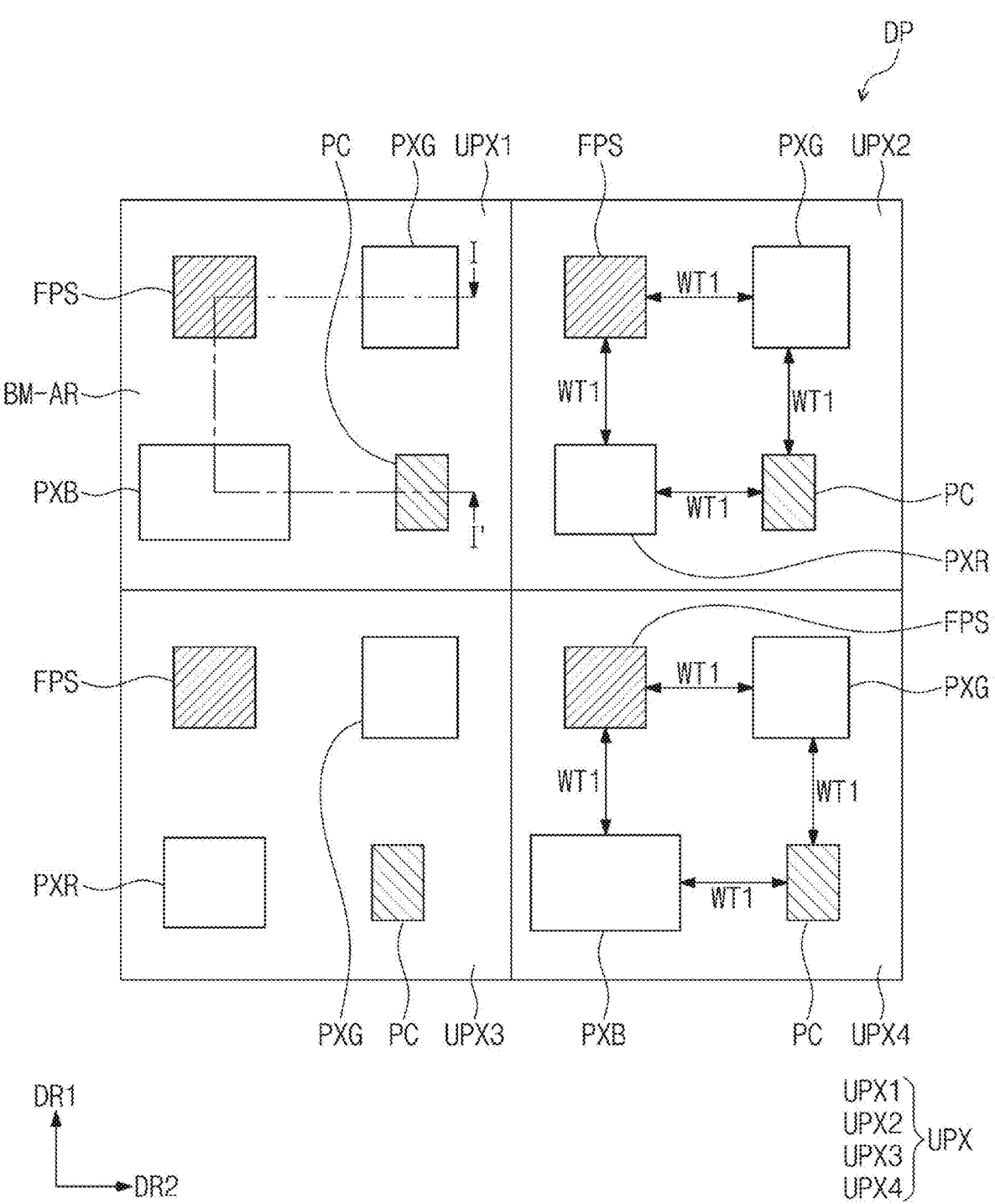
FIG. 5 is a plan view of a display device according to an embodiment.

FIG. 5 is a plan view illustrating a display device according to an embodiment of the present disclosure. FIG. 5 is a plan view of a display panel DP according to an embodiment. FIG. 5 shows a unit pixel area UPX of the display panel DP.

Figure 6:
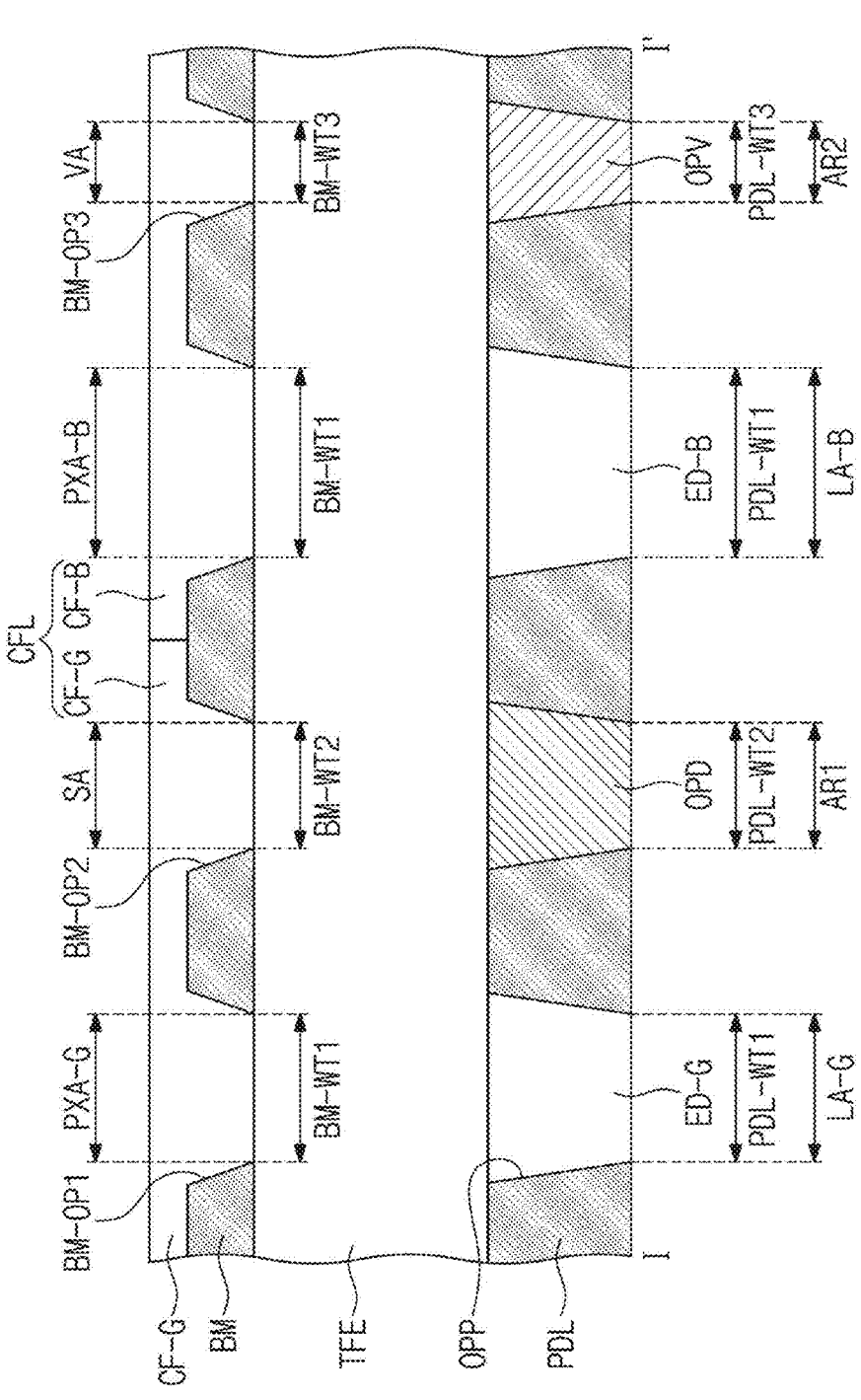
FIG. 6 is a cross-sectional view of a display device according to an embodiment.

FIG. 6 is a cross-sectional view of a display device according to an embodiment of the present disclosure. FIG. 6 is a cross-sectional view taken along the line I to I' of FIG. 5.

Referring to FIG. 5, the unit pixel area UPX may be defined in the display panel DP. A plurality of unit pixel areas UPX may be provided. The unit pixel area UPX may include a first unit pixel area UPX1, a second unit pixel area UPX2, a third unit pixel area UPX3, and a fourth unit pixel area UPX4. The first unit pixel area UPX1 and the fourth unit pixel area UPX4 may correspond to (e.g., may be the same or substantially the same as) each other, and the second unit pixel area UPX2 and the third unit pixel area UPX3 may correspond to (e.g., may be the same or substantially the same as) each other.

In a first column extending in the first direction DR1, the first unit pixel area UPX1 and the third unit pixel area UPX3 may be repeatedly arranged. In a second column, the second unit pixel area UPX2 and the fourth unit pixel area UPX4 may be repeatedly arranged. In a first row extending in the second direction DR2, the first unit pixel area UPX1 and the second unit pixel area UPX2 may be repeatedly arranged. In a second row, the third unit pixel area UPX3 and the fourth unit pixel area UPX4 may be repeatedly arranged.

For convenience, the first unit pixel area UPX1 and the second unit pixel area UPX2 may be described in more detail hereinafter. The fourth unit pixel area UPX4 may have the same or substantially the same structure as that of the first unit pixel area UPX1, and the third unit pixel area UPX3 may have the same or substantially the same structure as that of the second unit pixel area UPX2, and thus, redundant description thereof may not be repeated.

An optical sensor FPS, a green pixel PXG, a blue pixel PXB, and a photovoltaic cell PC may be disposed at (e.g., in or on) the first unit pixel area UPX1. An optical sensor FPS, a green pixel PXG, a red pixel PXR, and a photovoltaic cell PC may be disposed at (e.g., in or on) the second unit pixel area UPX2. In other words, one optical sensor FPS and one photovoltaic cell PC may be disposed in one unit pixel area. A light blocking area BM-AR may be defined between areas in which the optical sensor FPS, the green pixel PXG, the blue pixel PXB, the red pixel PXR, and the photovoltaic cell PC are disposed.

The shape of each of the red pixel PXR, the green pixel PXG, and the blue pixel PXB may correspond to a square or a rectangle. The size of each of the red pixel PXR, the green pixel PXG, and the blue pixel PXB may be different from each other.

The shape of the optical sensor FPS may be a square. The shape of the photovoltaic cell PC may be rectangular. The shape of the optical sensor FPS and the shape of the photovoltaic cell PC may be different from each other. The shape of the optical sensor FPS and the shape of the photovoltaic cell PC may be determined according to an interval between adjacent ones of the pixels PXR, PXG, and PXB. The shapes of the optical sensor FPS and the photovoltaic cell PC may not need to be the same as each other, and may be determined to be a square or a rectangular in order to have the same or substantially the same spacing as each other from the adjacent ones of the pixels PXR, PXG, and PXB.

In a plane, the optical sensor FPS and the photovoltaic cell PC are spaced apart from each other (e.g., in a plan view). In the first direction DR1 and the second direction DR2, the optical sensor FPS and the photovoltaic cell PC may be disposed to be adjacent to the green pixel PXG, the blue pixel PXB, and/or the red pixel PXR.

A first width WT1 that is a separation distance between the optical sensor FPS and an adjacent green pixel PXG, blue pixel PXB, and/or red pixel PXR may be the same or substantially the same as each other. A separation distance between the photovoltaic cell CP and the adjacent green pixel PXG, blue pixel PXB, and/or red pixel PXR may also be the same or substantially the same as the first width WT1.

In FIGS. 5 and 6, the green pixel PXG may be disposed in the green pixel area PXA-G. The blue pixel PXB may be disposed in the blue pixel area PXA-B. The red pixel PXR may be disposed in the red pixel area PXA-R (e.g., refer to FIG. 9). The optical sensor FPS may be disposed in the first area AR1. The photovoltaic cell PC may be disposed in the second area AR2. The first area AR1 and the second area AR2 may be spaced apart from each other, with at least one pixel area therebetween. The pixel areas PXA-R, PXA-G, and PXA-B may be spaced apart from each other with the first area AR1 or the second area AR2 therebetween.

Referring to FIG. 6, a light shielding layer BM and a color filter layer CFL may be disposed on the display element layer DP_ED including the pixel defining film PDL, the light emitting elements, the light detection element, and the photovoltaic element. The encapsulation layer TFE may be disposed between the display element layer DP_ED and the light shielding layer BM, and between the display element layer DP_ED and the color filter layer CFL.

The light shielding layer BM may include a first opening part BM-OP1, a second opening part BM-OP2, and a third opening part BM-OP3. The color filter layer CFL may include a green color filter CF-G and a blue color filter CF-B. A boundary between the green color filter CF-G and the blue color filter CF-B may be defined on a light blocking pattern of the light shielding layer BM.

In FIG. 6, the green light emitting element ED-G may be disposed in the green light emitting area LA-G. The blue light emitting element ED-B may be disposed in the blue light emitting area LA-B. The green light emitting area LA-G may overlap with the green pixel area PXA-G, and the blue light emitting area LA-B may overlap with the blue pixel area PXA-B.

The pixel areas PXA-G and PXA-B may be defined by a plurality of the first opening parts BM-OP1 of the light shielding layer BM. For example, each of the green pixel area PXA-G and the blue pixel area PXA-B may be defined by a corresponding one of the first opening parts BM-OP1. The red pixel area PXA-R (e.g., see FIG. 9) may also be defined by a corresponding one of the first opening parts BM-OP1.

The light emitting area may be defined as an area in which light emitting elements are disposed in opening parts of the pixel defining film PDL. For example, the green light emitting area LA-G may be an area where the green light emitting element ED-G is disposed, and the blue light emitting area LA-B may be an area where the blue light emitting element ED-B is disposed. A width PDL-WT1 of the light emitting area may correspond to the area of the light emitting element.

In an embodiment, the width PDL-WT1 of the light emitting area may be equal to or substantially equal to a width BM-WT1 of the pixel area. The width of the green light emitting area LA-G and the width of the blue light emitting area LA-B may be different from each other. The width of the green pixel area PXA-G and the width of the blue pixel area PXA-B may be different from each other. However, the width of the green light emitting area LA-G and the width of the green pixel area PXA-G may be the same or substantially the same as each other, and the width of the blue light emitting area LA-B and the width of the blue pixel area PXA-B may be the same or substantially the same as each other.

The first area AR1 may correspond to an area in which the light detection element OPD is disposed. The first area AR1 may be defined by the pixel defining film PDL. The light detection area SA may be defined by the second opening part BM-OP2 of the light shielding layer BM. In other words, a width BM-WT2 of the second opening part BM-OP2 and a width BM-WT2 of the light detection area SA may be the same or substantially the same as each other. The light detection area SA and the first area AR1 may overlap with each other.

In an embodiment, the width BM-WT2 of the light detection area SA and the width PDL-WT2 of the first area AR1 may be the same or substantially the same as each other. However, the present disclosure is not limited thereto, and the width BM-WT2 of the light detection area SA may be smaller than the width of the first area AR1.

The second area AR2 may be an area in which the photovoltaic element OPV is disposed. The second area AR2 may be defined by the pixel defining film PDL. The photovoltaic cell area VA may be defined by the third opening part BM-OP3 of the light shielding layer BM. In other words, a width BM-WT3 of the third opening part BM-OP3 and a width BM-WT3 of the photovoltaic cell area VA may be the same or substantially the same as each other. The photovoltaic cell area VA and the second area AR2 may overlap with each other.

In an embodiment, the width BM-WT3 of the photovoltaic cell area VA may be the same or substantially the same as the width PDL-WT3 of the second area AR2. However, the present disclosure is not limited thereto, and the width BM-WT3 of the photovoltaic cell area VA may be greater than the width PDL-WT3 of the second area AR2.

In an embodiment, the width BM-WT2 of the light detection area SA may be smaller than the width PDL-WT2 of the first area AR1, and the width BM-WT3 of the photovoltaic cell area VA may be larger than the width PDL-WT3 of the second area AR2, which will be described in more detail below with reference to FIGS. 7 through 9.

In an embodiment, the width BM-WT2 of the light detection area SA may be smaller than the width BM-WT3 of the photovoltaic cell area VA. In other words, the width and/or size of the second opening part BM-OP2 may be smaller than the width and/or size of the third opening part BM-OP3.

The first area AR1 and the second area AR2 may be spaced apart from each other with at least one light emitting area therebetween. For example, the first area AR1 and the second area AR2 may be spaced apart from each other with the blue light emitting area LA-B therebetween.

The green color filter CF-G may cover the green light emitting area LA-G and the first area AR1. The blue color filter CF-B may cover the blue light emitting area LA-B and the second area AR2. The color filter covering the light detection element OPD and the color filter covering the photovoltaic element OPV may be different from each other. In other words, the light detection element OPD may overlap with the green color filter CF-G, and the photovoltaic element OPV may overlap with the blue color filter CF-B.

Figure 7:
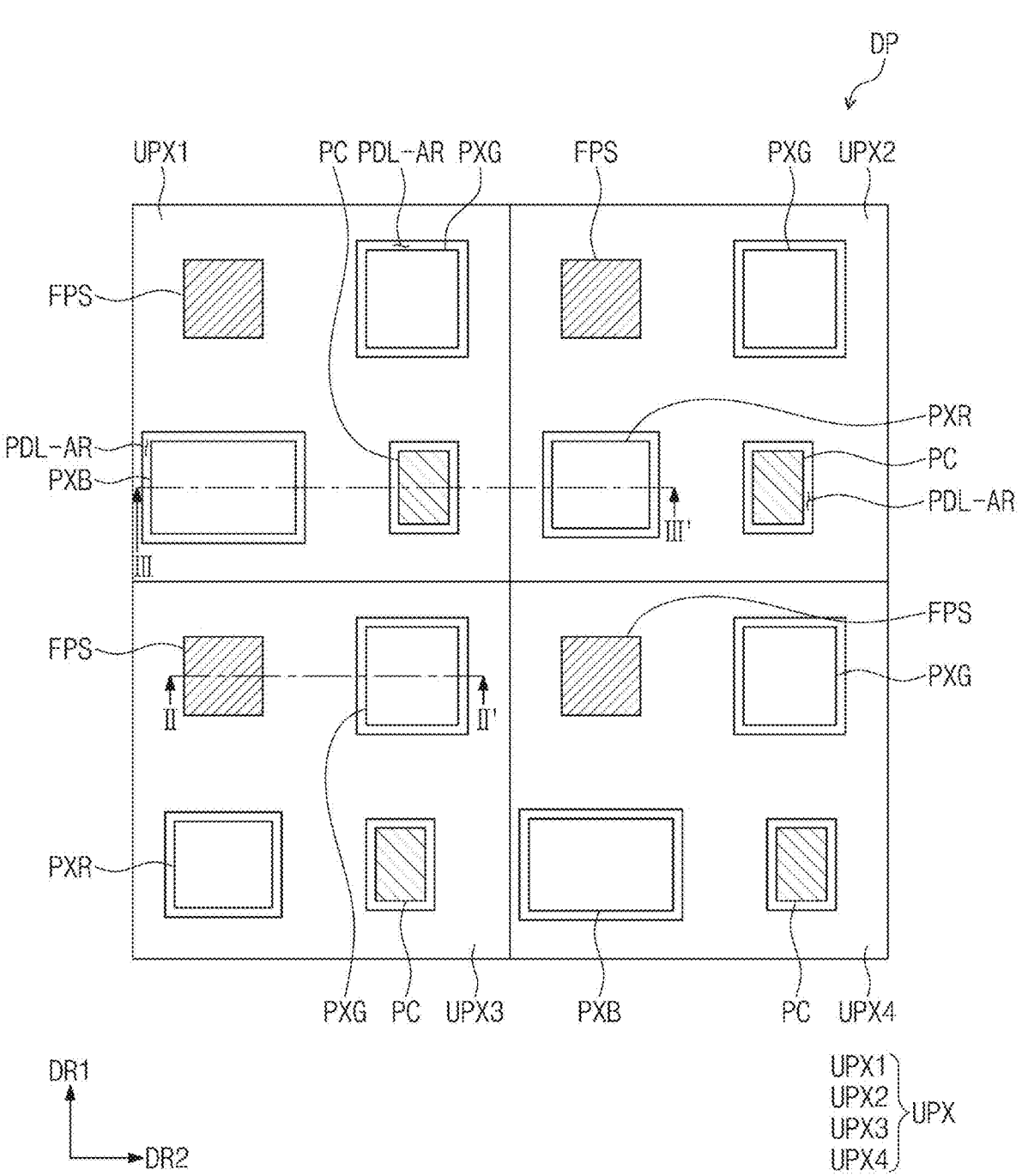
FIG. 7 is a plan view of a display device according to an embodiment.

FIG. 7 is a plan view of a display device according to an embodiment of the present disclosure. FIG. 8 is a cross-sectional view of a display device according to an embodiment of the present disclosure. FIG. 9 is a cross-sectional view of a display device according to an embodiment of the present disclosure.

Figure 8:
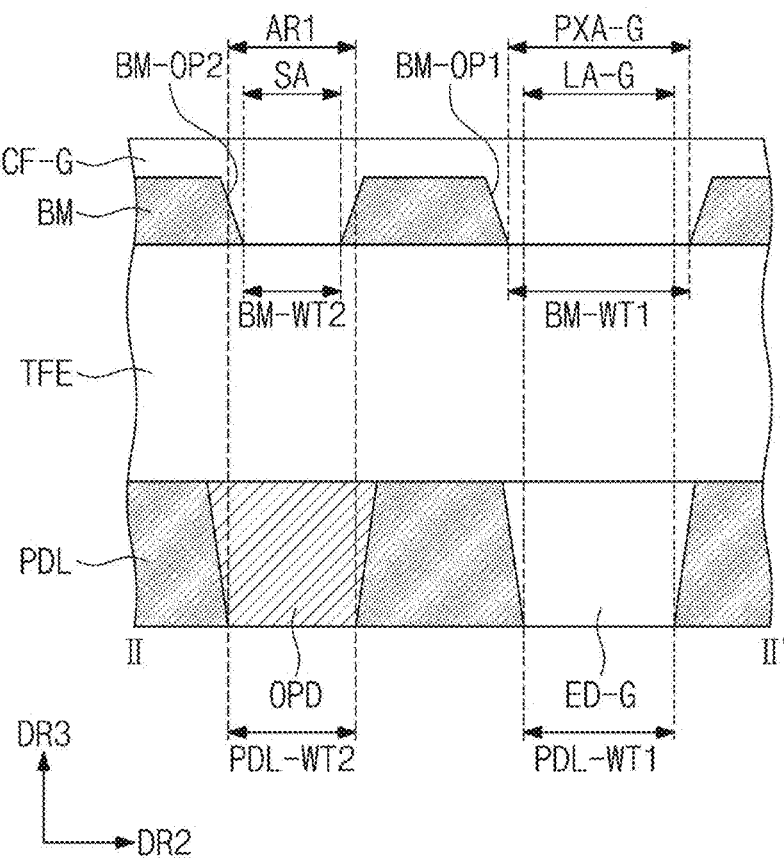
FIG. 8 is a cross-sectional view of a display device according to an embodiment.
Figure 9:
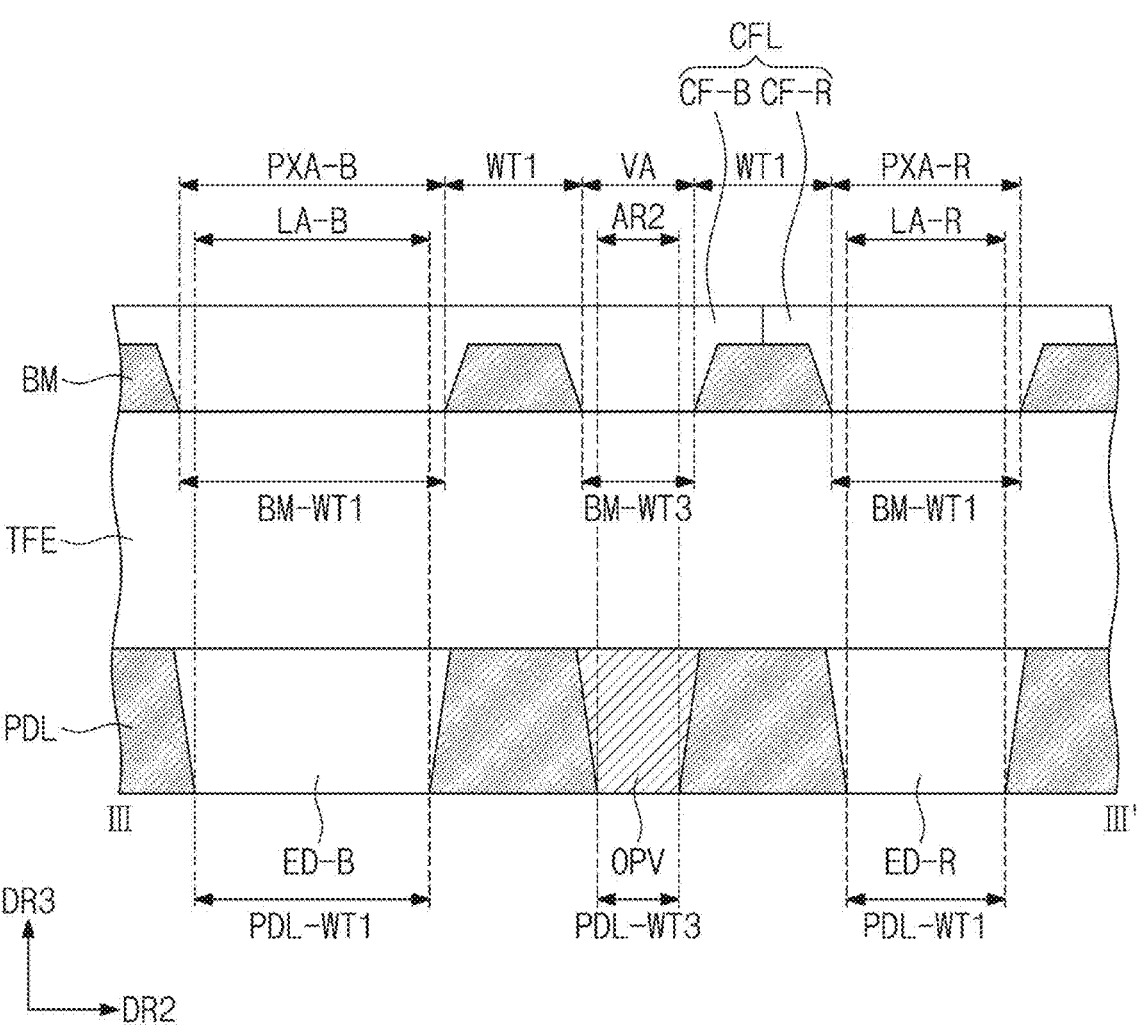
FIG. 9 is a cross-sectional view of a display device according to an embodiment.

Unlike the embodiments shown in FIGS. 5 and 6, in the embodiments shown in FIGS. 7 to 9, the size of the pixel area and the size of the light emitting area may be different from each other, the size of the light detection area and the size of the first area may be different from each other, and the size of the photovoltaic cell area and the size of the second area may be different from each other. Otherwise, the embodiments shown in FIGS. 7 to 9 may be the same or substantially the same as one or more of the embodiments described above, and thus, redundant description thereof may not be repeated.

In FIG. 7, the sizes of the pixel areas PXA-R, PXA-G, and PXA-B in which the pixels PXR, PXG, and PXB are defined may be larger than the sizes of the light emitting areas LA-R, LA-G, and LA-B in which the light emitting elements ED-R, ED-G, and ED-B are disposed, respectively. Accordingly, on a plane (e.g., in a plan view), areas PDL-AR may be defined to which parts of the pixel defining film PDL are exposed. The pixel defining film PDL may be exposed through the opening parts of the light shielding layer BM. The exposed areas PDL-AR may be defined around (e.g., adjacent to) at least one pixel area from among the plurality of pixel areas PXA-R, PXA-G, and PXA-B, and the photovoltaic cell area VA.

The size of the light detection area SA in which the optical sensor FPS is defined may be smaller than the size of the first area AR1 in which the light detection element OPD is disposed. The size of the photovoltaic cell area VA in which the photovoltaic cell CP is defined may be larger than the size of the second area AR2 in which the photovoltaic element OPV is disposed.

In the photovoltaic cell area VA, because the size of the photovoltaic cell area VA is larger than the size of the second area AR2, while the exposed area PDL-AR is defined around the light detection area VA, the size of the light detection area SA is smaller than the size of the first area AR1, so that the exposed area PDL-AR is not defined around the light detection area SA. This will be described in more detail with reference to FIGS. 8 and 9, and redundant description as those with reference to FIG. 5 may not be repeated.

FIG. 8 is a cross-sectional view taken along the line II to II' of FIG. 7.

In FIG. 8, the size of the light detection area SA may be smaller than the size of the first area AR1. In other words, the width BM-WT2 of the second opening part BM-OP2 defining the light detection area SA may be smaller than the width PDL-WT2 of the first area AR1 in which the light detection element OPD is disposed. In order to focus the reflected light IP-L on the light detection element OPD, the size of the light detection area SA may be smaller than the size of the first area AR1.

The size of the pixel area may be larger than the size of the light emitting area. For example, the width BM-WT1 of the green pixel area PXA-G may be greater than the width PDL-WT1 of the green light emitting area LA-G. In other words, the width BM-WT1 of the first opening part BM-OP1 of the light shielding layer BM defining the green pixel area PXA-G may be larger than the width PDL-WT1 of the green light emitting area LA-G.

The green color filter CF-G may cover the green light emitting area LA-G and the first area AR1.

FIG. 9 is a cross-sectional view taken along the line III to III' of FIG. 7.

In FIG. 9, the photovoltaic cell area VA in which the photovoltaic cell CP (e.g., refer to FIG. 7) is disposed may be disposed between the blue pixel area PXA-B and the red pixel area PXA-R. The separation width WT1 between the photovoltaic cell area VA and the blue pixel area PXA-B may be the same or substantially the same as the separation width WT1 between the photovoltaic cell area VA and the red pixel area PXA-R.

The size of the blue pixel area PXA-B may be larger than the size of the blue light emitting area LA-B. The size of the red pixel area PXA-R may be larger than the size of the red light emitting area LA-R. In other words, the width BM-WT1 of the first opening part defining the blue pixel area PXA-B may be greater than the width PDL-WT1 of the blue light emitting area LA-B. The width BM-WT1 of the first opening part defining the red pixel area PXA-R may be greater than the width PDL-WT1 of the red light emitting area LA-R.

The photovoltaic cell area VA overlaps with the second area AR2 in which the photovoltaic element OPV is disposed. The size of the photovoltaic cell area VA may be larger than the size of the second area AR2. In other words, the width BM-WT3 of the third opening part BM-OP3 defining the photovoltaic cell area VA may be greater than the width PDL-WT3 of the second area AR2. In order to sufficiently receive the external light EX-L to generate energy, the size of the photovoltaic cell area VA may be larger than the size of the second area AR2.

Therefore, even when the area of the light detection element OPD is larger than the area of the photovoltaic element OPV, the size of the light detection area SA may be smaller than the size of the photovoltaic cell area VA.

The blue color filter CF-B may cover the blue light emitting element ED-B and the photovoltaic element OPV, and the red color filter CF-R may cover the red light emitting element ED-R.

Figure 10:
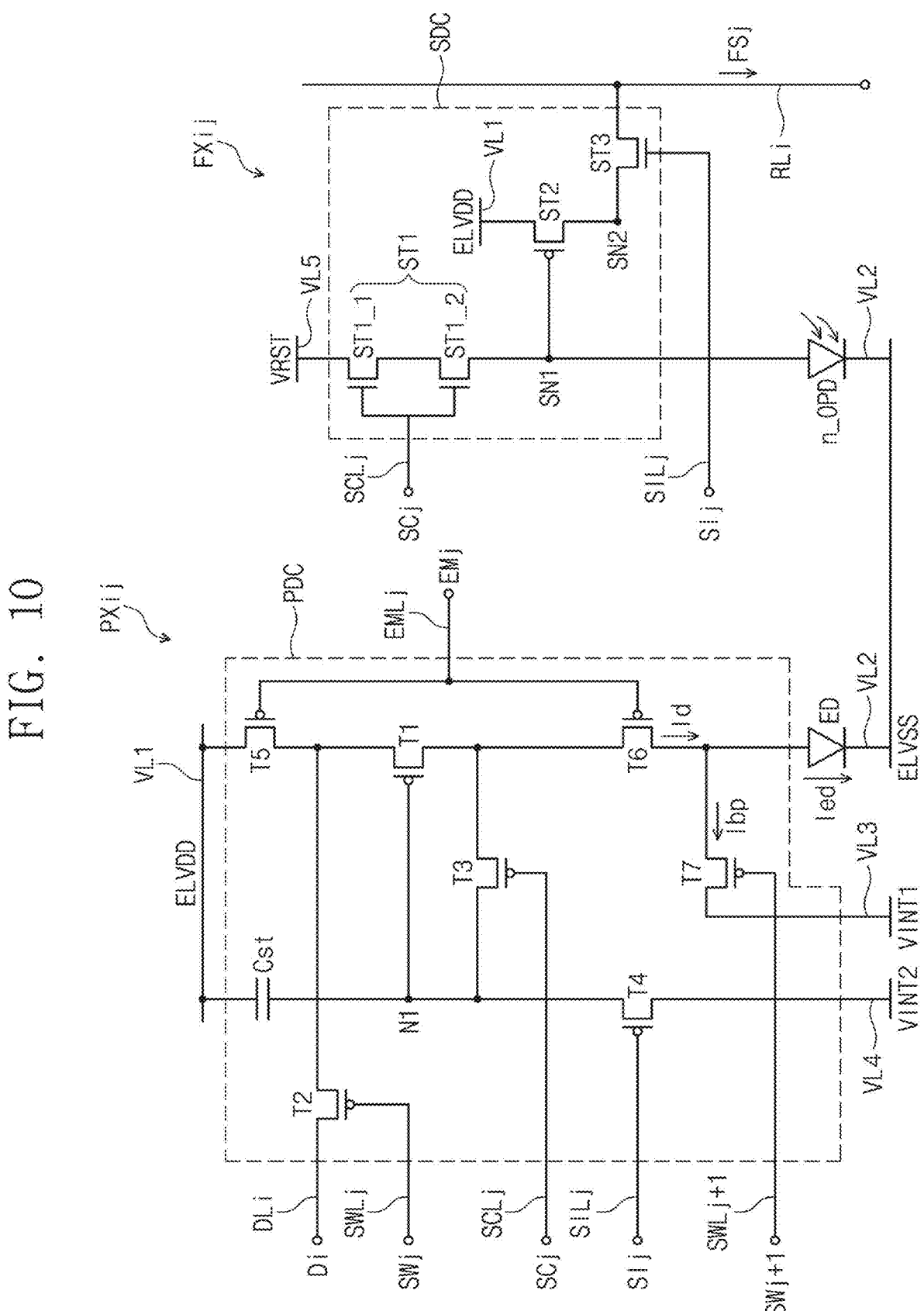
FIG. 10 is an equivalent circuit diagram of a pixel driving circuit and a sensor driving circuit according to an embodiment.
Figure 11:
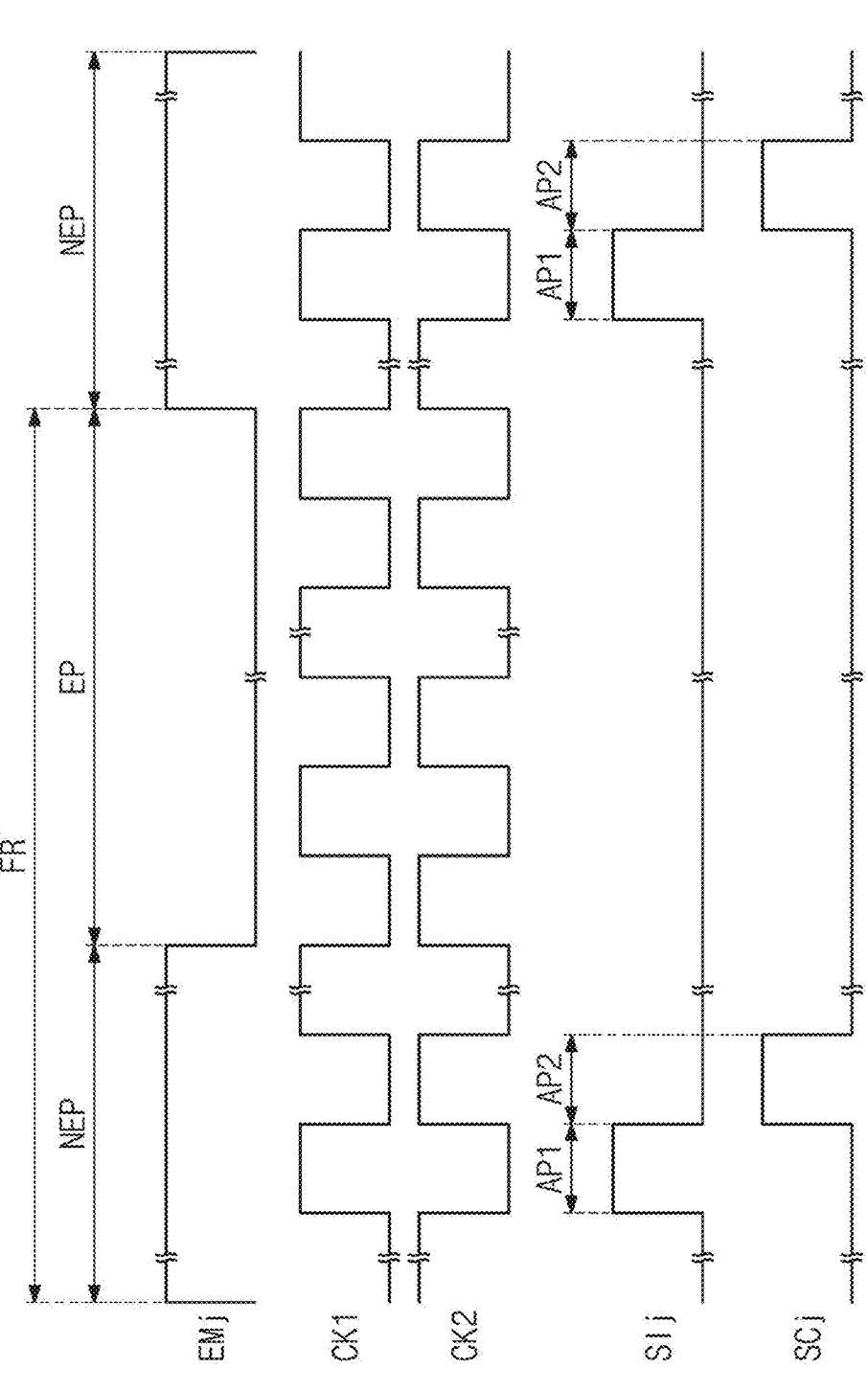
FIG. 11 is a waveform diagram illustrating an operation of the sensor driving circuit shown in FIG. 10.

FIG. 10 is an equivalent circuit diagram of a pixel driving circuit and a sensor driving circuit according to an embodiment of the present disclosure. FIG. 11 is a waveform diagram illustrating an operation of the sensor driving circuit shown in FIG. 10. The pixel driving circuit is included in the pixel driving unit PDC, and the sensor driving circuit is included in the sensor driving unit SDC.

FIG. 10 illustrates, as an example, the equivalent circuit diagram of one pixel PXij from among the plurality of pixels PX shown in FIG. 3. Because each of the plurality of pixels PX may have the same or substantially the same circuit structure as that of the pixel PXij shown in FIG. 10, redundant description thereof may not be repeated. Also, FIG. 10 illustrates, as an example, the equivalent circuit diagram of one sensor FXij from among the plurality of sensors FX shown in FIG. 3. Because each of the plurality of sensors FX may have the same or substantially the same circuit structure as that of the sensor FXij shown in FIG. 10, redundant description thereof may not be repeated.

Referring to FIG. 10, the pixel PXij is connected to an i-th data line DLi (hereinafter, referred to simply as a data line) from among the data lines DL1 to DLm, a j-th initialization scan line SILj (hereinafter, referred to simply as an initialization scan line) from among the initialization scan lines SIL1 to SILn, a j-th compensation scan line SCLj (hereinafter, referred to simply as a compensation scan line) from among the compensation scan lines SCL1 to SCLn, j-th and j+1-th write scan lines SWLj and SWLj+1 (hereinafter, referred to simply as first and second write scan lines) from among the write scan lines SWL1 to SWLn+1, and a j-th emission control line EMLj (hereinafter, referred to simply as an emission control line) from among the emission control lines EML1 to EMLn. Here, each of i and j is a natural number.

The pixel PXij includes a light emitting element ED, and a pixel driving unit (e.g., a pixel driving circuit) PDC. The light emitting element ED may be a light emitting diode. As an example, the light emitting element ED may be an organic light emitting diode including an organic light emitting layer.

The pixel driving unit PDC includes first to seventh transistors T1, T2, T3, T4, T5, T6, and T7, and a capacitor Cst. All of the first to seventh transistors T1 to T7 may be P-type transistors. As another example, all of the first to seventh transistors T1 to T7 may be N-type transistors.

In an embodiment, each of the first to seventh transistors T1 to T7 may be a transistor having a low-temperature polycrystalline silicon (LTPS) semiconductor layer. Some of the first to seventh transistors T1 to T7 may be P-type transistors, and others thereof may be N-type transistors. For example, from among the first to seventh transistors T1 to T7, the first, second, and fifth to seventh transistors T1, T2, and T5 to T7 may be PMOS transistors, and the third and fourth transistors T3 and T4 may be NMOS transistors including an oxide semiconductor as a semiconductor layer. In an embodiment, at least one of the first to seventh transistors T1 to T7 may be an N-type transistor, and the rest thereof may be P-type transistors. The configuration of the pixel driving unit PDC according to various embodiments of the present disclosure is not limited to the embodiment shown in FIG. 10. The pixel driving unit PDC illustrated in FIG. 10 is provided as an example, and thus, the configuration of the pixel driving unit PDC may be variously modified as would be understood by those having ordinary skill in the art.

The initialization scan line SILj, the compensation scan line SCLj, the first and second write scan lines SWLj and SWLj+1, and the emission control line EMLj may transmit a j-th initialization scan signal SIj (hereinafter, referred to simply as an initialization scan signal), a j-th compensation scan signal SCj (hereinafter, referred to simply as a compensation scan signal), a j-th and j+1-th write scan signals SWj and SWj+1 (hereinafter, referred to simply as first and second write scan signals), and a j-th emission control signal EMj (hereinafter, referred to simply as an emission control signal), respectively, to the pixel PXij. The data line DLi transmits a data signal Di to the pixel PXij. The data signal Di may have a voltage level corresponding to the image signal RGB that is input to the display device DD (e.g., refer to FIG. 3).

The pixel PXij may be further connected to a first driving voltage line VL1, a second driving voltage line VL2, a first initialization voltage line VL3, and a second initialization voltage line VL4. The first and second driving voltage lines VL1 and VL2 may transmit a first driving voltage ELVDD and a second driving voltage ELVSS, respectively, to the pixel PXij. The first and second initialization voltage lines VL3 and VL4 may transmit a first initialization voltage VINT1 and a second initialization voltage VINT2, respectively, to the pixel PXij.

The first transistor T1 is connected between the first driving voltage line VL1 for receiving the first driving voltage ELVDD and the light emitting element ED. The first transistor T1 includes a first electrode connected to the first driving voltage line VL1 through the fifth transistor T5, a second electrode electrically connected to the anode of the light emitting element ED through the sixth transistor T6, and a third electrode (e.g., a gate electrode) connected to one end of the capacitor Cst. The first transistor T1 may receive the data signal Di transmitted from the data line DL according to a switching operation of the second transistor T2, and may supply a driving current Id to the light emitting element ED.

The second transistor T2 is connected between the data line DLi and the first electrode of the first transistor T1. The second transistor T2 includes a first electrode connected to the data line DLi, a second electrode connected to the first electrode of the first transistor T1, and a third electrode (e.g., a gate electrode) connected to the first write scan line SWLj. The second transistor T2 is turned on according to the first write scan signal SWj received through the first write scan line SWLj, so that the second transistor T2 may transmit the data signal Di transmitted from the data line DLi to the first electrode of the first transistor T1.

The third transistor T3 is connected between the second electrode of the first transistor T1 and a first node N1. The third transistor T3 includes a first electrode connected to the third electrode of the first transistor T1 (e.g., at the first node N1), a second electrode connected to the second electrode of the first transistor T1, and a third electrode (e.g., a gate electrode) connected to the compensation scan line SCLj. The third transistor T3 is turned on according to the compensation scan signal SCj received through the compensation scan line SCLj to diode-connect the first transistor T1, by connecting the third electrode and the second electrode of the first transistor T1 to each other.

The fourth transistor T4 is connected between the second initialization line VL4 to which the second initialization voltage VINT2 is applied and the first node N1. The fourth transistor T4 includes a first electrode connected to the third electrode of the first transistor T1 (e.g., at the first node N1), a second electrode connected to the second initialization voltage line VL4 to which the second initialization voltage VINT2 is transmitted, and a third electrode (e.g., a gate electrode) connected to the initialization scan line SILj. The fourth transistor T4 is turned on according to the initialization scan signal SIj received through the initialization scan line SILj. The turned-on fourth transistor T4 transmits the second initialization voltage VINT2 to the third electrode of the first transistor T1 to initialize a potential of the third electrode of the first transistor T1 (e.g., to initialize the potential of the first node N1).

The fifth transistor T5 includes a first electrode connected to the first driving voltage line VL1, a second electrode connected to the first electrode of the first transistor T1, and a third electrode (e.g., a gate electrode) connected to the emission control line EMLj. The fifth transistor T5 may be referred to as a first emission control transistor.

The sixth transistor T6 includes a first electrode connected to the second electrode of the first transistor T1, a second electrode connected to the anode of the light emitting element ED, and a third electrode (e.g., a gate electrode) connected to the emission control line EMLj. The sixth transistor T6 may be referred to as a second emission control transistor.

The fifth transistor T5 and the sixth transistor T6 are concurrently (e.g., simultaneously or substantially simultaneously) turned on according to the emission control signal EMj transmitted through the emission control line EMLj. The first driving voltage ELVDD applied through the turned-on fifth transistor T5 may be compensated through the diode-connected first transistor T1, and then transmitted to the light emitting element ED.

The seventh transistor T7 includes a first electrode connected to the first initialization voltage line VL3 to which the first initialization voltage VINT1 is transmitted, a second electrode connected to the second electrode of the sixth transistor T6, and a third electrode (e.g., a gate electrode) connected to the second write scan line SWLj+1. The first initialization voltage VINT1 may have a voltage level equal to or lower than that of the second initialization voltage VINT2. As an example, each of the first and second initialization voltages VINT1 and VINT2 may have a voltage of about −3.5V.

As described above, one end of the capacitor Cst is connected to the third electrode of the first transistor T1. Another end of the capacitor Cst is connected to the first driving voltage line VL1. The cathode of the light emitting element ED may be connected to the second driving voltage line VL2 for transmitting the second driving voltage ELVSS. The second driving voltage ELVSS may have a lower voltage level than that of the first driving voltage ELVDD. As an example, the second driving voltage ELVSS may have a lower voltage level than those of the first and second initialization voltages VINT1 and VINT2.

When a high level initialization scan signal SIj is provided through the initialization scan line SILj, the fourth transistor T4 is turned on in response to the high level initialization scan signal SIj. The second initialization voltage VINT2 is transmitted to the third electrode of the first transistor T1 through the turned-on fourth transistor T4, and the first node N1 is initialized by the second initialization voltage VINT2. Accordingly, a high level section of the initialization scan signal SIj may be an initialization section of the pixel PXij.

Next, when a high level compensation scan signal SCj is supplied through the compensation scan line SCLj, the third transistor T3 is turned on. The first transistor T1 is diode-connected by the turned-on third transistor T3, and is biased in the forward direction. Also, the second transistor T2 is turned on by a low level first write scan signal SWj. Then, a compensation voltage "Di-Vth" that is reduced by a threshold voltage Vth of the first transistor T1 from the data signal Di supplied from the data line DLi is applied to the third electrode of the first transistor T1. In other words, the potential of the third electrode of the first transistor T1 may be the compensation voltage "Di-Vth".

The first driving voltage ELVDD and the compensation voltage "Di-Vth" are applied to both ends of the capacitor Cst, and a charge corresponding to a voltage difference between the both ends may be stored in the capacitor Cst. Here, a high-level section of the compensation scan signal SCj may be referred to as a compensation section of the pixel PXij.

The seventh transistor T7 is turned on by receiving a low-level second write scan signal SWj+1 through the second write scan line SWLj+1. A portion of the driving current Id may escape through the seventh transistor T7 as a bypass current Ibp by the seventh transistor T7.

Even when a minimum current of the first transistor T1 for displaying a black image flows as the driving current Id, if the light emitting element ED emits light, the black image may not be properly displayed. Accordingly, the seventh transistor T7 of the pixel PXij according to an embodiment of the present disclosure may distribute a portion of the minimum current of the first transistor T1 as the bypass current Ibp through a current path other than the current path toward the light emitting element ED. Here, the minimum current of the first transistor T1 may refer to a current under a condition in which the first transistor T1 is turned off, because the gate-source voltage Vgs of the first transistor T1 is less than the threshold voltage Vth. In this case, the minimum driving current (e.g., a current of 10 pA or less) under the condition of turning off the first transistor T1 is transmitted to the light emitting element ED, and is expressed as an image of a black luminance. When the minimum driving current to display a black image flows, the effect of bypass transmission of the bypass current Ibp may be large, but when a large driving current that displays an image, such as a normal or white image, flows, there may be little effect of the bypass current Ibp. Therefore, when the driving current for displaying a black image flows, an emission current Ied of the light emitting element ED, which is reduced by the amount of the bypass current Ibp escaping from the driving current Id through the seventh transistor T7, has the minimum amount of current at a level that may reliably represent a black image. Accordingly, an accurate black luminance image may be implemented using the seventh transistor T7 to improve a contrast ratio.

Next, the emission control signal EMj supplied from the emission control line EMLj is changed from a high level to a low level. The fifth transistor T5 and the sixth transistor T6 are turned on by the low-level emission control signal EMj.

Then, a driving current Id is generated according to a voltage difference between the voltage of the third electrode of the first transistor T1 and the first driving voltage ELVDD, and the driving current Id is supplied to the light emitting element ED through the sixth transistor T6, so that the current Ied flows through the light emitting element ED.

Referring to FIG. 10, the sensor FXij is connected to an i-th readout line RLi (hereinafter, referred to simply as a readout line) from among the readout lines RL1 to RLm, the initialization scan line SILj, and the compensation scan line SCLj. The sensor FXij may be further connected to the first and second driving voltage lines VL1 and VL2, and a reset voltage line VL5.

The sensor FXij includes a light detection element OPD and a sensor driving unit (e.g., a sensor driving circuit) SDC. In an embodiment, the sensor FXij may include a plurality of light detection elements n_OPD, and one sensor driving unit (e.g., one sensor driving circuit) SDC. For example, n light detection elements n_OPD may be connected to one sensor driving unit SDC, where n is a natural number greater than or equal to 1. The light detection element OPD may be a photodiode. As an example, the light detection element OPD may be an organic photodiode including an organic material as a photoelectric conversion layer. The anode of the light detection element OPD may be connected to a first sensing node SN1, and the cathode of the light detection element OPD may be connected to the second driving voltage line VL2 for transmitting the second driving voltage ELVSS.

The sensor driving unit SDC includes three transistors ST1 to ST3. The three transistors ST1 to ST3 may include a reset transistor ST1, an amplification transistor ST2, and an output transistor ST3. Some of the reset transistor ST1, the amplification transistor ST2, and the output transistor ST3 may be P-type transistors, and some may be N-type transistors. As an example, the amplification transistor ST2 may be a PMOS transistor, and the reset transistor ST1 and the output transistor ST3 may be NMOS transistors. However, the present disclosure is not limited thereto, and all of the reset transistor ST1, the amplification transistor ST2, and the output transistor ST3 may be N-type transistors or P-type transistors.

Some of the reset transistor ST1, the amplification transistor ST2, and the output transistor ST3 (e.g., such as the reset transistor ST1 and the output transistor ST3) may be the same kind of transistor as those of the third and fourth transistors T3 and T4 of the pixel PXij. Some of the reset transistor ST1, the amplification transistor ST2, and the output transistor ST3 (e.g., such as the amplification transistor ST2) may be the same kind of transistors as those of the first and second transistors T1 and T2 of the pixel PXij.

The circuit configuration of the sensor driving unit SDC according to one or more embodiments of the present disclosure is not limited to that shown in FIG. 10. The sensor driving unit SDC illustrated in FIG. 10 is provided as an example, and the configuration of the sensor driving unit SDC may be variously modified as needed or desired.

The reset transistor ST1 includes a first electrode connected to the reset voltage line VL5 for receiving a reset voltage VRST, a second electrode connected to the first sensing node SN1, and a third electrode (e.g., a gate electrode) connected to the compensation scan line SCLj for receiving the compensation scan signal SCj. The reset transistor ST1 may reset a potential of the first sensing node SN1 to the reset voltage VRST in response to the compensation scan signal SCj. As an example, the reset voltage VRST may have a voltage level corresponding to an activation section (e.g., a low-level section) of the first and second write scan signals SWj and SWj+1. The reset voltage VRST may have a lower voltage level than that of the second driving voltage ELVSS.

In some embodiments, the reset transistor ST1 may include a plurality of sub-reset transistors ST1_1 and ST1_2 connected in series between the reset voltage line VL5 and the first sensing node SN1. As an example, the reset transistor ST1 includes a first sub-reset transistor ST1_1 and a second sub-reset transistor ST1_2. A third electrode (e.g., a gate electrode) of the first sub-reset transistor ST1_1 and a third electrode (e.g., a gate electrode) of the second sub-reset transistor ST1_2 are connected to the compensation scan line SCLj. Also, a second electrode of the first sub-reset transistor ST1_1 and a first electrode of the second sub-reset transistor ST1_2 may be electrically connected to each other. In addition, a first electrode of the first sub-reset transistor ST1_1 may be connected to the reset voltage line VL5, and a second electrode of the second sub-reset transistor ST1_2 may be electrically connected to the first sensing node SN1. However, the number of sub-reset transistors is not limited to the number shown in FIG. 10, and may be variously modified as needed or desired.

The amplification transistor ST2 includes a first electrode connected to the first driving voltage line VL1 for receiving the first driving voltage ELVDD, a second electrode connected to a second sensing node SN2, and a third electrode (e.g., a gate electrode) connected to the first sensing node SN1. The amplification transistor ST2 may be turned on according to the potential of the first sensing node SN1 to apply the first driving voltage ELVDD to the second sensing node SN2.

The output transistor ST3 includes a first electrode connected to the second sensing node SN2, a second electrode connected to the readout line RLi, and a third electrode (e.g., a gate electrode) connected to the initialization scan line SILj for receiving the initialization scan signal SIj. The output transistor ST3 may transmit a detection signal FSj to the readout line RLi in response to the initialization scan signal SIj.

Referring to FIG. 11, one frame FR may include an emission section EP and a non-emission section NEP according to an operation of the pixel PXij. The emission section EP corresponds to the low-level section (e.g., the activation section) of the emission control signal EMj, and the non-emission section NEP corresponds to a high-level section (e.g., a deactivation section) of the emission control signal EMj. As an example, when the display panel DP (e.g., see FIG. 3) operates at about 60 Hz, one frame FR may have a duration corresponding to about 16.7 ms. The duration of one frame FR may vary according to the driving frequency of the display panel DP.

One frame FR may include a detection section AP1, a reset section AP2, and a light exposure section that is divided according to an operation of the sensor FXij. The detection section AP1 and the reset section AP2 may overlap with the non-emission section NEP. The light exposure section of the sensor FXij may correspond to the emission section EP of the pixel PXij. A light detection element OPD is exposed to light during the emission section EP. The light may be output from the light emitting element ED of the pixel PXij.

When the user's hand US_F (e.g., see FIG. 1) touches (e.g., contacts) the display surface, the light detection element OPD generates photocharges corresponding to the light reflected by ridges and/or valleys between the ridges of the fingerprint, and the generated photocharges may be accumulated in the first sensing node SN1.

The amplification transistor ST2 may be a source follower amplifier that generates a source-drain current in proportion to the amount of charge of the first sensing node SN1 input to the third electrode of the amplification transistor ST2.

During the detection section AP1, the high level initialization scan signal SIj is supplied to the output transistor ST3 through the initialization scan line SILj. The detection section AP1 may be defined as an activation section (e.g., a high level section) of the initialization scan signal SIj. The duration of the activation section of the initialization scan signal SIj and the compensation scan signal SCj is determined by the duration of the high section of a corresponding clock signal. For example, the initialization scan signal SIj has an active section corresponding to the high section of the corresponding first clock signal CK1, and the compensation scan signal SCj has an active section corresponding to the high section of the corresponding second clock signal CK2. The first and second clock signals CK1 and CK2 may have inverted phases from each other. Accordingly, the activation section of the initialization scan signal SIj and the activation section of the compensation scan signal SCj may not overlap with each other.

When the output transistor ST3 is turned on in response to the high level initialization scan signal SIj, a detection signal FSi corresponding to a current flowing through the amplification transistor ST2 may be output to the readout line RLi. The detection section AP1 of the sensor FXij may correspond to an initialization section of the pixel PXij.

Next, when the high level compensation scan signal SCj is supplied through the compensation scan line SCLj during the reset section AP2, the reset transistor ST1 is turned on. The reset section AP2 may be defined as an activation section (e.g., a high level section) of the compensation scan signal SCj. In this case, because the reset voltage VRST is provided to the first electrode of the reset transistor ST1, the first sensing node SN1 may be reset to the reset voltage VRST. The reset section AP2 of the sensor FXij may correspond to the compensation section of the pixel PXij.

Next, during the emission section EP, the light detection element OPD may generate photocharges corresponding to the received light, and the generated photocharges may be accumulated in the first sensing node SN1.

As described above, the display panel DP includes the pixel PXij and the sensor FXij, and the sensor FXij may be driven using the initialization scan signal SIj and the compensation scan signal SCj for driving the pixel PXij. In more detail, the initialization scan signal SIj and the compensation scan signal SCj supplied to the third and fourth transistors T3 and T4 of the pixel PXij may be supplied to the reset transistor ST1 and the output transistor ST3 of the sensor FXij. Accordingly, because a separate signal line or circuit used to drive the sensor FXij is unnecessary, even when the sensor Fxij is disposed at (e.g., in or on) the display panel DP, a reduction in an aperture ratio may be minimized, reduced, prevented, or substantially prevented.

Figure 12:
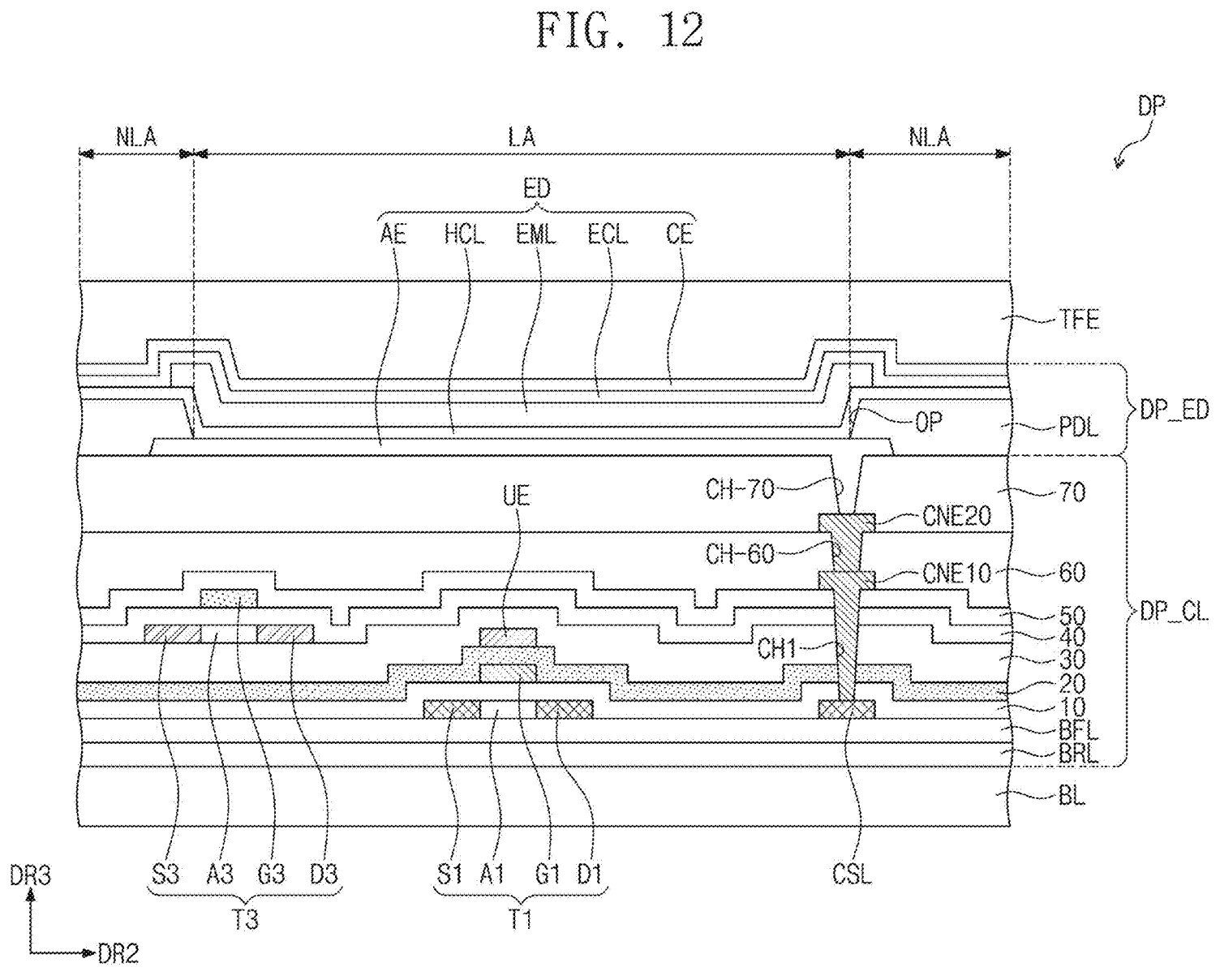

FIG. 12 is a cross-sectional view illustrating a pixel of a display panel according to an embodiment.

Referring to FIG. 12, the display panel DP may include a base layer BL, a circuit layer DP_CL disposed on the base layer BL, a display element layer DP_ED, and an encapsulation layer TFE.

The base layer BL may include a synthetic resin layer. The synthetic resin layer may include a thermosetting resin. For example, the synthetic resin layer may be a polyimide resin layer, but the material thereof is not particularly limited. The synthetic resin layer may include at least one of acrylic resin, methacrylic resin, polyisoprene, vinyl resin, epoxy resin, urethane resin, cellulose resin, siloxane resin, polyamide resin, and perylene resin. In addition, the base layer BL may include a glass substrate, a metal substrate, or an organic/inorganic composite material substrate.

At least one inorganic layer is formed on an upper surface of the base layer BL. The inorganic layer may include at least one of aluminum oxide, titanium oxide, silicon oxide silicon oxynitride, zirconium oxide, and hafnium oxide. The inorganic layer may be formed in multiple layers. The multi-layered inorganic layers may constitute a barrier layer BRL and/or a buffer layer BFL, which will be described in more detail below. The barrier layer BRL and the buffer layer BFL may be selectively disposed.

The barrier layer BRL prevents or substantially prevents foreign substances from being introduced from the outside. The barrier layer BRL may include a silicon oxide layer and/or a silicon nitride layer. Each of these layers may be provided in a plurality, and a plurality of silicon oxide layers and silicon nitride layers may be alternately stacked.

The buffer layer BFL may be disposed on the barrier layer BRL. The buffer layer BFL improves a bonding force between the base layer BL and a semiconductor pattern and/or a conductive pattern. The buffer layer BFL may include a silicon oxide layer and/or a silicon nitride layer. For example, the silicon oxide layer and the silicon nitride layer may be alternately stacked.

A semiconductor pattern is disposed on the buffer layer BFL. Hereinafter, the semiconductor pattern that is directly disposed on the buffer layer BFL is defined as a first semiconductor pattern. The first semiconductor pattern may include a silicon semiconductor. The first semiconductor pattern may include polysilicon. However, the present disclosure is not limited thereto, and the first semiconductor pattern may include amorphous silicon.

FIG. 12 illustrates a portion of the first semiconductor pattern, and the first semiconductor pattern may be further disposed at (e.g., in or on) another area of the pixel PXij (e.g., refer to FIG. 10). The first semiconductor pattern has different electrical properties depending on whether or not it is doped. The first semiconductor pattern may include a doped area and a non-doped area. The doped area may be doped with an N-type dopant or a P-type dopant. The P-type transistor includes a doped area that is doped with a P-type dopant, and the N-type transistor includes a doped area that is doped with an N-type dopant.

The doped area is more conductive than the non-doped area, and serves or substantially serves as an electrode or a signal line. The non-doped area corresponds to an active (e.g., a channel) of the transistor. In other words, a portion of the first semiconductor pattern may be an active of the transistor, another portion may be a source or a drain of the transistor, and another portion may be a connection signal line or a connection electrode.

As shown in FIG. 12, a first electrode S1, a channel part A1, and a second electrode D1 of the first transistor T1 are formed from the first semiconductor pattern. The first electrode S1 and the second electrode D1 of the first transistor T1 extend in opposite directions from each other from the channel part A1.

FIG. 12 illustrates a part of a connection signal line CSL formed from a semiconductor pattern. The connection signal line CSL may be connected to the second electrode of the sixth transistor T6 (e.g., refer to FIG. 10) on a plane (e.g., in a plan view).

A first insulating layer 10 is disposed on the buffer layer BFL. The first insulating layer 10 overlaps with the plurality of pixels PX (e.g., refer to FIG. 3) in common, and covers the first semiconductor pattern. The first insulating layer 10 may be an inorganic layer and/or an organic layer, and may have a single layer structure or a multilayered structure. The first insulating layer 10 may include at least one of aluminum oxide, titanium oxide, silicon oxide, silicon oxynitride, zirconium oxide, and hafnium oxide. In the present embodiment, the first insulating layer 10 may be a single-layer of a silicon oxide layer. In addition to the first insulating layer 10, an insulating layer of the circuit layer DP_CL to be described in more detail below may be an inorganic layer and/or an organic layer, and may have a single layer or multilayered structure. The inorganic layer may include at least one of the above-described materials.

A third electrode G1 of the first transistor T1 is disposed on the first insulating layer 10. The third electrode G1 may be a part of a metal pattern. The third electrode G1 of the first transistor T1 overlaps with the channel part A1 of the first transistor T1. In a process of doping the first semiconductor pattern, the third electrode G1 of the first transistor T1 may function as a mask.

A second insulating layer 20 covering the third electrode G1 is disposed on the first insulating layer 10. The second insulating layer 20 overlaps with the plurality of pixels PX in common. The second insulating layer 20 may be an inorganic layer and/or an organic layer, and may have a single layer structure or a multilayered structure. In the present embodiment, the second insulating layer 20 may be a single-layer of a silicon oxide layer.

An upper electrode UE may be disposed on the second insulating layer 20. The upper electrode UE may overlap with the third electrode G1. The upper electrode UE may be a part of a metal pattern, or a part of a doped semiconductor pattern. A portion of the third electrode G1 and the upper electrode UE overlapping with the portion may define the capacitor Cst (e.g., refer to FIG. 10). In an embodiment of the present disclosure, the upper electrode UE may be omitted.

In an embodiment of the present disclosure, the second insulating layer 20 may be replaced with an insulating pattern. In this case, the upper electrode UE is disposed on the insulating pattern. The upper electrode UE may serve as a mask for forming an insulating pattern from the second insulating layer 20.

A third insulating layer 30 covering the upper electrode UE is disposed on the second insulating layer 20. In the present embodiment, the third insulating layer 30 may be a single-layer of a silicon oxide layer. A semiconductor pattern is disposed on the third insulating layer 30. Hereinafter, the semiconductor pattern that is directly disposed on the third insulating layer 30 is defined as a second semiconductor pattern. The second semiconductor pattern may include a metal oxide. The oxide semiconductor may include a crystalline or amorphous oxide semiconductor. For example, the oxide semiconductor may include a metal oxide of zinc (Zn), indium (In), gallium (Ga), tin (Sn), and/or titanium (Ti), or a mixture of metals from among zinc (Zn), indium (In), gallium (Ga), tin (Sn), and titanium (Ti) and a suitable oxide thereof. Oxide semiconductors may include indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), zinc-tin oxide (ZTO), and/or the like.

FIG. 12 illustrates a portion of the second semiconductor pattern, and the second semiconductor pattern may be further disposed at (e.g., in or on) another area of the pixel PXij (e.g., refer to FIG. 10). The second semiconductor pattern may include a plurality of areas divided according to whether or not the metal oxide is reduced. The area in which the metal oxide is reduced (hereinafter, referred to as the reduced area) has higher conductivity than the area in which the metal oxide is not reduced (hereinafter, referred to as the non-reduced area). The reduced area has the role or substantially the role of an electrode or a signal line. The non-reduced area corresponds to or substantially corresponds to the channel part of the transistor. In other words, a portion of the second semiconductor pattern may be a channel part of the transistor, and another portion thereof may be a first electrode or a second electrode of the transistor.

As shown in FIG. 12, a first electrode S3, a channel part A3, and a second electrode D3 of the third transistor T3 are formed from the second semiconductor pattern. The first electrode S3 and the second electrode D3 include a metal reduced from the metal oxide semiconductor. The first electrode S3 and the second electrode D3 may have a suitable thickness (e.g., a predetermined thickness) from an upper surface of the second semiconductor pattern, and may include a metal layer including the reduced metal.

A fourth insulating layer 40 covering the second semiconductor pattern is disposed on the third insulating layer 30. In the present embodiment, the fourth insulating layer 40 may be a single-layer of a silicon oxide layer. The third electrode G3 of the third transistor T3 is disposed on the third insulating layer 30. The third electrode G3 may be a part of the metal pattern. The third electrode G3 of the third transistor T3 overlaps with the channel part A3 of the third transistor T3.

In an embodiment of the present disclosure, the fourth insulating layer 40 may be replaced with an insulating pattern. The third electrode G3 of the third transistor T3 is disposed on the insulating pattern. In this case, the third electrode G3 may have the same or substantially the same shape as that of the insulating pattern in a plan view. In the present embodiment, one third electrode G3 is illustrated for convenience of illustration, but the present disclosure is not limited thereto, and the third transistor T3 may include two third electrodes.

A fifth insulating layer 50 covering the third electrode G3 is disposed on the fourth insulating layer 40. In the present embodiment, the fifth insulating layer 50 may include a silicon oxide layer and/or a silicon nitride layer. The fifth insulating layer 50 may include a plurality of silicon oxide layers and silicon nitride layers that are alternately stacked.

The first electrode and the second electrode of the fourth transistor T4 (e.g., refer to FIG. 10) may be formed through the same or substantially the same process as that of the first electrode S3 and the second electrode D3 of the third transistor T3. In addition, the first and second electrodes of the reset transistor ST1, and the first and second electrodes of the output transistor ST3 of the sensor FXij (e.g., see FIG. 10) may be formed through the same or substantially the same process as that of the first electrode S3 and the second electrode D3 of the third transistor T3.

At least one insulating layer is further disposed on the fifth insulating layer 50. In the present embodiment, a sixth insulating layer 60 and a seventh insulating layer 70 may be disposed on the fifth insulating layer 50. The sixth insulating layer 60 and the seventh insulating layer 70 may be organic layers, and may have a single-layer structure or a multilayered structure. The sixth insulating layer 60 and the seventh insulating layer 70 may be a single polyimide-based resin layer. However, the present disclosure is not limited thereto, and the sixth insulating layer 60 and the seventh insulating layer 70 may include at least one of acrylic resin, methacrylic resin, polyisoprene, vinyl-based resin, epoxy-based resin, urethane-based resin, cellulose-based resin, siloxane-based resin, polyamide-based resin, or perylene-based resin.

A first connection electrode CNE10 may be disposed on the fifth insulating layer 50. The first connection electrode CNE10 may be connected to the connection signal line CSL through a first contact hole CH1 penetrating the first to fifth insulating layers 10 to 50. A second connection electrode CNE20 may be connected to the first connection electrode CNE10 through a contact hole CH-60 passing through (e.g., penetrating) the sixth insulating layer 60. In an embodiment of the present disclosure, at least one of the fifth insulating layer 50 and the sixth insulating layer 60 may be omitted as needed or desired.

The display element layer DP_ED includes a light emitting element ED and a pixel defining film PDL. The anode AE of the light emitting element ED is disposed on the seventh insulating layer 70. The anode AE of the light emitting element ED may be connected to the second connection electrode CNE20 through a contact hole CH-70 penetrating the seventh insulating layer 70.

The opening part OP of the pixel defining film PDL exposes at least a portion of the anode AE of the light emitting element ED. The opening part OP of the pixel defining film PDL may define the light emitting area LA. For example, the plurality of pixels PX (e.g., refer to FIG. 3) may be disposed on a plane of the display panel DP in a regular manner. An area in which the plurality of pixels PX are disposed may be defined as a pixel area, and one pixel area may include a light emitting area LA and a non-light emitting area NLA adjacent to the light emitting area LA. The non-light emitting area NLA may surround (e.g., around a periphery of) the light emitting area LA.

The hole control layer HCL may be commonly disposed at (e.g., in or on) the light emitting area LA and the non-light emitting area NLA. A common layer, such as the hole control layer HCL, may be commonly formed in the plurality of pixels PX. The hole control layer HCL may include a hole transport layer and/or a hole injection layer.

A light emitting layer EML is disposed on the hole control layer HCL. The light emitting layer EML may be disposed in an area corresponding to the opening part OP. The light emitting layer EML may be formed separately in each of the plurality of pixels PX.

Although a patterned light emitting layer EML is illustrated as an example in the present embodiment, the present disclosure is not limited thereto, and the light emitting layer EML may be commonly disposed on the plurality of pixels PX. In this case, the light emitting layer EML may generate white light or blue light. In addition, the light emitting layer EML may have a multilayered structure.

The electron control layer ECL is disposed on the light emitting layer EML. The electron control layer ECL may include an electron transport layer and/or an electron injection layer. A cathode CE of the light emitting element ED is disposed on the electron control layer ECL. The electron control layer ECL and the cathode CE are commonly disposed in the plurality of pixels PX.

An encapsulation layer TFE is disposed on the cathode CE. The encapsulation layer TFE may cover the plurality of pixels PX. In the present embodiment, the encapsulation layer TFE directly covers the cathode CE. In an embodiment of the present disclosure, the display panel DP may further include a capping layer directly covering the cathode CE. In an embodiment of the present disclosure, a stacked structure of the light emitting element ED may have a vertically inverted structure from the structure shown in FIG. 12.

The display device according to one or more embodiments of the present disclosure includes a light detection element and a photovoltaic element to reduce power consumption, while maintaining or substantially maintaining an existing light emitting lifetime.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. An electronic device comprising:
   a base layer;
   a display element layer on the base layer, and comprising a light emitting element, a photovoltaic element adjacent to the light emitting element, and a pixel defining film having a plurality of openings;
   a light shielding layer on the display element layer, and having a plurality of opening parts; and
   a color filter layer on the display element layer, and covering the plurality of opening parts,
   wherein the light emitting element comprises first electrode,
   wherein the photovoltaic element comprises first electrode and a photovoltaic cell layer disposed on the first electrode of the photovoltaic element,
   wherein the plurality of openings comprises a first opening that exposes at least a portion of the first electrode of the light emitting element and a second opening that exposes at least a portion of the first electrode of the photovoltaic element, and
   wherein the photovoltaic element is a photovoltaic cell configured to receive incident light to generate electrical energy used to drive the electronic device.

2. The electronic device of claim 1, wherein the display element layer further comprises a light detection element, and
   wherein the light detection element is configured to detect an external input based on reflected light.

3. The electronic device of claim 2, wherein the light detection element comprises first electrode, and
   wherein the plurality of openings further comprises a third opening that exposes at least a portion of the first electrode of the light detection element.

4. The electronic device of claim 3, wherein the light emitting element further comprises a light emitting layer disposed on the first electrode of the light emitting element, and the light detection element further comprises a light receiving layer disposed on the first electrode of the light detection element.

5. The electronic device of claim 3, wherein the first electrode of the light emitting element, the first electrode of the photovoltaic element, and the first electrode of the light detection element are located at a same layer as each other.

6. The electronic device of claim 2, wherein the color filter layer comprises:

a first color filter overlapping the light detection element; and a second color filter overlapping the photovoltaic element.

7. The electronic device of claim 6, wherein the first color filter is a green color filter and the second color filter is a blue color filter.

8. The electronic device of claim 2, wherein a plurality of light emitting areas, a first area, and a second area are defined in the display element layer, wherein the plurality of light emitting elements are respectively disposed in the plurality of light emitting areas, wherein the light detection element is disposed in the first area, wherein the photovoltaic element is disposed in the second area, and wherein at least one light emitting area among the plurality of light emitting areas is disposed between the first area and the second area.

9. The electronic device of claim 8, wherein the first area is spaced from an adjacent light emitting area from among the plurality of light emitting areas by a first width, and the second area is spaced from an adjacent light emitting area from among the plurality of light emitting areas by a second width, and wherein the first width and the second width are the same as each other.

10. The electronic device of claim 9, wherein the plurality of light emitting areas comprise a first light emitting area for emitting a first color light, a second light emitting area for emitting a second color light, and a third light emitting area for emitting a third color light, wherein the first light emitting area, the second light emitting area, and the third light emitting area are spaced from each other with any one of the first area or the second area therebetween.

11. The electronic device of claim 2, wherein the plurality of opening parts of the light shielding layer comprises:

a first opening part corresponding to the light emitting element;

a second opening part corresponding to the light detection element; and a third opening part corresponding to the photovoltaic element.

12. The electronic device of claim 11, wherein a size of the second opening part is smaller than a size of the third opening part.

13. The electronic device of claim 1, further comprising:

a thin film encapsulation layer on the display element layer; and an input detection layer on the thin film encapsulation layer, wherein the input detection layer is directly on the thin film encapsulation layer.

14. An electronic device comprising:

a plurality of light emitting elements in a plurality of light emitting areas, respectively;

a first element in a first area defined between the plurality of light emitting areas; and a pixel defining film including a plurality of openings, wherein each of the plurality of light emitting elements comprises a first electrode and a light emitting layer disposed on the first electrode, wherein the first element comprises a first electrode and a photovoltaic cell layer disposed on the first electrode of the first element, wherein the plurality of openings comprises a first opening that overlaps the first electrode of one of the light emitting elements and a second opening that overlaps the first electrode of the first element, and wherein the first element is a photovoltaic cell configured to receive incident light to generate electrical energy used to drive the electronic device.

15. The electronic device of claim 14, further comprising a second element in a second area defined between the plurality of light emitting areas, and configured to detect an external input based on reflected light.

16. The electronic device of claim 15, wherein the second element comprises a first electrode and a light receiving layer disposed on the first electrode of the second element, and wherein the first electrode of the one of the light emitting elements, the first electrode of the first element, and the first electrode of the second element are located at a same layer as each other.

17. The electronic device of claim 16, wherein the plurality of openings further comprises a third opening that overlaps the first electrode of the second element, and wherein the first opening exposes at least a portion of the first electrode of the one of the light emitting elements, the second opening exposes at least a portion of the first electrode of the first element, and the third opening exposes at least a portion of the first electrode of the second element.

18. The electronic device of claim 16, wherein the plurality of light emitting elements, the first element, and the second element further comprise a common electrode.

19. The electronic device of claim 18, wherein a first portion of the common electrode is disposed on the light emitting layer, a second portion of the common electrode is disposed on the photovoltaic cell layer, and a third portion of the common electrode is disposed on the light receiving layer.

20. The electronic device of claim 15, further comprising:

a first color filter overlapping the first element; and a second color filter overlapping the second element, wherein the first color filter is a blue color filter and the second color filter is a green color filter.

* * * * *